US012178009B2

(12) United States Patent
Liu et al.

(10) Patent No.: US 12,178,009 B2
(45) Date of Patent: Dec. 24, 2024

(54) LIQUID-COOLING HEAT DISSIPATION APPARATUS, LIQUID-COOLING DATA PROCESSING DEVICE AND TEMPERATURE EQUALIZATION METHOD

(71) Applicant: SHENZHEN MICROBT ELECTRONICS TECHNOLOGY CO., LTD., Guangdong (CN)

(72) Inventors: Fangyu Liu, Guangdong (CN); Qian Chen, Guangdong (CN); Yang Gao, Guangdong (CN); Yuefeng Wu, Guangdong (CN); Hongyan Ning, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 190 days.

(21) Appl. No.: 17/912,407

(22) PCT Filed: Apr. 22, 2021

(86) PCT No.: PCT/CN2021/088962
§ 371 (c)(1),
(2) Date: Sep. 16, 2022

(87) PCT Pub. No.: WO2021/258837
PCT Pub. Date: Dec. 30, 2021

(65) Prior Publication Data
US 2023/0189477 A1    Jun. 15, 2023

(30) Foreign Application Priority Data

Jun. 22, 2020  (CN) .......................... 202010571752.9
Nov. 20, 2020  (CN) .......................... 202011308704.7
Nov. 20, 2020  (CN) .......................... 202011312974.5

(51) Int. Cl.
*H05K 7/20* (2006.01)

(52) U.S. Cl.
CPC ..... *H05K 7/20254* (2013.01); *H05K 7/20281* (2013.01)

(58) Field of Classification Search
CPC ..................... H05K 7/20509; H05K 7/20336
See application file for complete search history.

(56) References Cited

U.S. PATENT DOCUMENTS 7,318,322 B2 * 1/2008 Ota .................... H05K 7/20781
62/305
10,582,645 B1 * 3/2020 Kufahl ............... H05K 7/20772
(Continued)

FOREIGN PATENT DOCUMENTS

CN  1485906 A   3/2004
CN  106654452 A  5/2017
(Continued)

*Primary Examiner* — Mukundbhai G Patel
(74) *Attorney, Agent, or Firm* — Dickinson Wright PLLC

(57) ABSTRACT

Disclosed in embodiments of the present application are a liquid-cooling heat dissipation apparatus, a liquid-cooling data processing device and a temperature equalization method. The liquid-cooling heat dissipation apparatus includes a housing unit and a first liquid-cooling plate arranged in the housing unit. A first electronic unit and a second electronic unit are arranged on a first cooling surface and a second cooling surface arranged oppositely of the first liquid-cooling plate respectively, and the first electronic unit and the second electronic unit may be, for example, hashboards, that is, in the liquid-cooling heat dissipation apparatus provided in the embodiment of the present application, one liquid-cooling plate is correspondingly provided with two hashboards.

20 Claims, 12 Drawing Sheets

(56) References Cited

U.S. PATENT DOCUMENTS

| | | | |
|---|---|---|---|
| 10,955,883 B1* | 3/2021 | Franz | G06F 1/26 |
| 2010/0326628 A1 | 12/2010 | Campbell et al. | |
| 2017/0181320 A1* | 6/2017 | Aoki | H05K 7/20145 |
| 2019/0006262 A1* | 1/2019 | Lewin | H05K 7/20418 |

FOREIGN PATENT DOCUMENTS

| | | |
|---|---|---|
| CN | 108170239 A | 6/2018 |
| CN | 108922875 A | 11/2018 |
| CN | 209657297 U | 11/2019 |
| CN | 111625073 A | 9/2020 |
| CN | 211878562 U | 11/2020 |
| CN | 212278664 U | 1/2021 |

\* cited by examiner

LIQUID-COOLING HEAT DISSIPATION APPARATUS, LIQUID-COOLING DATA PROCESSING DEVICE AND TEMPERATURE EQUALIZATION METHOD

CROSS-REFERENCE TO RELATED APPLICATIONS

The present application claims the priority to Chinese Patent Application No. 202010571752.9, filed on Jun. 22, 2020, Chinese Patent Application No. 202011312974.5, filed on Nov. 20, 2020, and Chinese Patent Application No. 202011308704.7, filed on Nov. 20, 2020, which are incorporated herein by reference.

TECHNICAL FIELD

The present application relates to the technical field of liquid-cooling heat dissipation, and in particular to a liquid-cooling heat dissipation apparatus, a liquid-cooling data processing device and a temperature equalization method.

BACKGROUND

Heat dissipation of the heating element in the electronic device, particularly various data processing devices, such as a virtual currency mining machine, has important influence on ensuring the normal operation of the electronic device. For the above heat dissipation requirement, liquid-cooling heat dissipation way with the liquid-cooling plate can be employed, that is, the liquid-cooling plate is arranged on the electronic device or the hashboard of the mining machine contiguously, and then heat can be dissipated from the electronic device or the hashboard that contacts with the liquid-cooling plate by circular flowing of cooling liquid in the liquid-cooling plate.

SUMMARY

An embodiment of the present application provides a liquid-cooling heat dissipation apparatus for carrying out liquid-cooling heat dissipation on an electronic device, the liquid-cooling heat dissipation apparatus includes:
a housing unit for accommodating the electronic device; and
a first liquid-cooling plate arranged in the housing unit, the first liquid-cooling plate having a first inlet connector and a first outlet connector,
wherein the electronic device includes a first electronic unit and a second electronic unit, the first liquid-cooling plate has a first cooling surface and a second cooling surface that are oppositely arranged, the first electronic unit is attached to the first cooling surface, the second electronic unit is attached to the second cooling surface; and
cooling liquid enters from the first inlet connector and flows out from the first outlet connector, such that the first liquid-cooling plate carries out liquid-cooling heat dissipation on the first electronic unit and the second electronic unit simultaneously.

An embodiment of the present application further provides a liquid-cooling data processing device, including an electronic device and a liquid-cooling heat dissipation apparatus bearing the electronic device, wherein the liquid-cooling heat dissipation apparatus is the above liquid-cooling heat dissipation apparatus, the electronic device includes a first electronic unit and a second electronic unit, wherein the first electronic unit and the second electronic unit are hashboards.

An embodiment of the present application additionally provides a temperature equalization method for a liquid-cooling heat dissipation apparatus, the temperature equalization method is applied to the liquid-cooling heat dissipation apparatus, the liquid-cooling heat dissipation apparatus is used for cooling a first electronic unit and a second electronic unit of an electronic device, the liquid-cooling heat dissipation apparatus includes a first liquid-cooling plate, and a second liquid-cooling plate and a third liquid-cooling plate that are located on two sides of the first liquid-cooling plate, the first liquid-cooling plate has a first cooling surface and a second cooling surface, the first electronic unit is located between the first liquid-cooling plate and the second liquid-cooling plate and is attached to the first cooling surface of the first liquid-cooling plate, the second electronic unit is located between the first liquid-cooling plate and the third liquid-cooling plate and is attached to the second cooling surface of the first liquid-cooling plate;

the temperature equalization method includes following steps:
controlling the first liquid-cooling plate, the second liquid-cooling plate and the third liquid-cooling plate to be connected in series and/or in parallel;
controlling an external cold source to convey cooling liquid to the first liquid-cooling plate, the second liquid-cooling plate and the third liquid-cooling plate; and
making the first liquid-cooling plate, the second liquid-cooling plate and the third liquid-cooling plate cool the first electronic unit and the second electronic unit respectively.

REFERENCE NUMERALS

Figure 1:
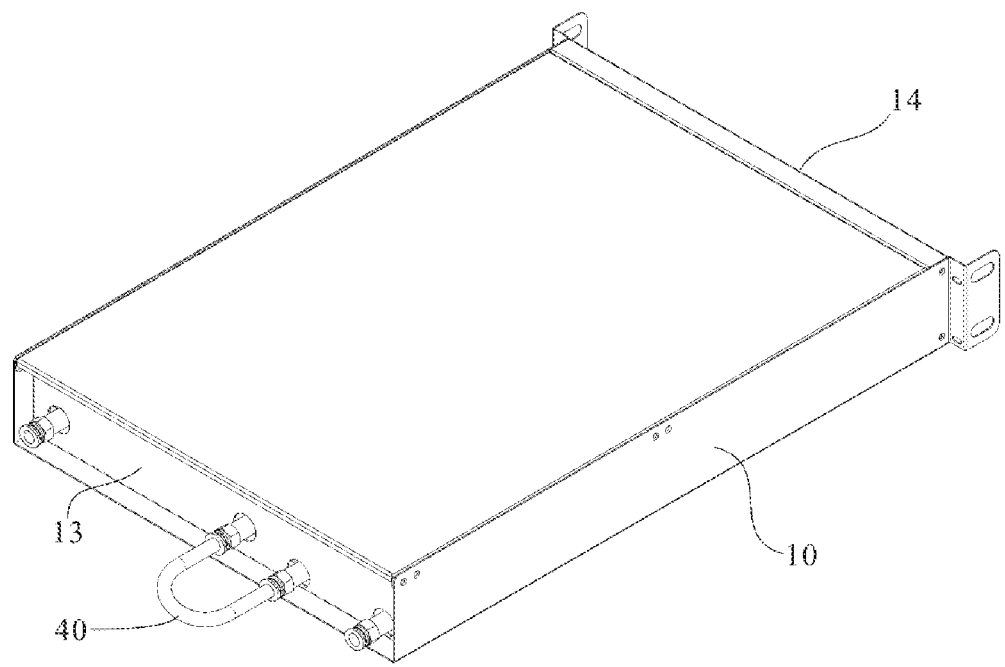
FIG. 1 is a structural schematic diagram of the liquid-cooling heat dissipation apparatus in an embodiment of the present application.

10—Housing unit, 11—Bearing housing, 13—First side plate, 14—Second side plate, 15—Mounting cover, 16—Power adapter, 17—Communication connector, 141—Fixing mounting plate, 142—Fixing mounting hole, 143—Lifting plate, 144—Lifting hole,
20—First liquid-cooling plate unit, 21—First electronic unit, 22—Second electronic unit, 23—First protective plate, 24—Second protective plate, 25—First inlet connector, 26—First outlet connector, 27—Adapter flange,
30—Fourth liquid-cooling plate unit, 31—Power supply device, 35—Second inlet connector, 36—Second outlet connector,
40—Adapter pipe,
50—Connection unit, 51—Guide groove, 52—Locking screw, 53—Screw hole,
60—Control board, 61—Adapter copper bar,
100—Liquid-cooling heat dissipation apparatus, 110—First liquid-cooling plate, 111—First liquid inlet/outlet, 112—Second liquid inlet/outlet, 120—Second liquid-cooling plate, 121—Third liquid inlet/outlet, 122—Fourth liquid inlet/outlet, 130—Third liquid-cooling plate, 131—Fifth liquid inlet/outlet, 132—Sixth liquid inlet/outlet,
200—Electronic device, 210—First electronic unit, 220—Second electronic unit,
1000—Liquid-cooling virtual currency mining machine, 1210—Liquid-cooling structure, 140—Fourth liquid-cooling plate, A7—Seventh liquid inlet/outlet, A8—Eighth liquid inlet/outlet, 1220—Pipeline structure, 1221—Liquid-cooling pipeline group, 1222—First liquid dispenser/collector, 1223—Second liquid dispenser/collector, 1224—Inlet connector, 1225—Outlet connector, 211—Anode, 212—Cathode, 213—Anode, 214—Joint, 215—Joint, 216—Joint, 217—Joint, 230—Power supply, 231—Input Terminal, 240—Connection assembly, 241—Positive copper bar, 2411—Positive fixing hole, 242—Positive cable, 243—Negative copper bar, 2441—Negative fixing hole, 244—Negative cable, 400—Case housing, 410—Bearing housing, 420—First side plate, 430—Second side plate, 440—Case cover plate.

Detailed Description of the Embodiments

In order to understand the above technical solution better, the above technical solution will be described in detail in combination with the drawings and the specific embodiment of the description below. Many specific details are set forth in the following description to facilitate full understanding of the present application. However, the present application may be implemented in many other ways different from those described herein, similar improvements may be made by those skilled in the art without departing from the connotation of the present application, and therefore the present application is not limited by the particular embodiments disclosed below.

In the description of the present application, it is to be understood that the terms "central", "longitudinal", "transverse", "length", "width", "thickness", "upper", "lower", "front", "back", "left", "right", "vertical", "horizontal", "top", "bottom", "inner", "outer", "clockwise", "counterclockwise", "axial", "radial", "circumferential", etc. indicate the azimuthal or positional relation based on those shown in the drawings only for ease of description of the present application and for simplicity of description, and are not intended to indicate or imply that the referenced device or element must have the particular orientation and be constructed and operative in the particular orientation, and thus may not be construed as a limitation on the present application.

In addition, the terms "first", "second" and so forth are for descriptive purposes only and are not to be construed as indicating or implying their relative importance or implicitly specifying the number of indicated technical features. Thus, a feature defined with "first" and "second" may explicitly or implicitly include at least one of the features. In the description of the present application, "plurality" means at least two, for example, two, three, etc., unless expressly specified otherwise.

In the present application, unless expressly specified and defined otherwise, the terms "mount", "connect", "connected", "fix", etc. are to be construed broadly and, for example, may be fixedly connected, or detachably connected, or integrally formed, may be mechanically connected, or electrically connected, may be directly connected or indirectly connected by means of an intermediary medium, or may be an internal communication between two elements or an interaction relation between two elements, unless expressly defined otherwise. For those of ordinary skill in the art, the specific meanings of the above terms in the present application may be understood according to specific circumstances.

In the present application, unless expressly specified and defined otherwise, a first feature being "above" or "below" a second feature may be direct contact between the first feature and the second feature, or indirect contact between the first feature and the second feature by means of an intermediate medium. Moreover, the first feature being "on", "above", and "over" the second feature may be the first feature being directly above or obliquely above the second feature, or only indicate that a horizontal height of the first feature is higher than that of the second feature. The first feature being "under," "below," and "beneath" the second feature may be the first feature being directly below or obliquely below the second feature, or only indicate that a horizontal height of the first feature is less than that of the second feature.

It should be illustrated that when an element is referred to as being "fixed to" or "arranged on" another element, the element may be directly on another element or there may be an intermediate element. When an element is considered to be "connected" to another element, the element may be directly connected to another element or there may be an intermediate element simultaneously. The terms "vertical", "horizontal", "upper", "lower", "left", "right" and similar expressions used herein are only for illustrative purposes, and do not mean the only implementation.

In some related technologies, when the liquid-cooling plate is used for carrying out liquid-cooling heat dissipation treatment on the electronic device, the liquid-cooling plate is usually arranged on one or two sides of the hashboard, that is, one hashboard usually corresponds to one or two liquid-cooling plates, such that when a plurality of hashboards are used in a stacked manner, the number of the liquid-cooling plates is large, which results in that the number of adapters is large, and there is a risk of cooling liquid leakage at the adapters, such that there may be many risk points of cooling liquid leakage. Therefore, on the premise that the liquid-cooling heat dissipation effect is ensured, how to effectively reduce the number of risk points of cooling liquid leakage becomes a problem to be solved.

An embodiment of the present application provides the liquid-cooling heat dissipation apparatus. The liquid-cooling heat dissipation apparatus is used for carrying out liquid-cooling heat dissipation on the electronic device. With reference to FIGS. 1-5, the liquid-cooling heat dissipation apparatus includes the housing unit 10 and the first liquid-cooling plate unit 20. The housing unit may also be referred to as the bearing housing. The housing unit 10 is used for accommodating the electronic device, and the housing unit 10 has the first side plate 13 and the second side plate 14 that are oppositely arranged. The first liquid-cooling plate unit 20 is arranged in the housing unit 10, and the first liquid-cooling plate unit 20 has the first inlet connector 25 and the first outlet connector 26. The electronic device includes the first electronic unit 21 and the second electronic unit 22. The first liquid-cooling plate unit 20 has the first heat dissipation surface and the second heat dissipation surface that are oppositely arranged, the first electronic unit 21 is attached to the first heat dissipation surface, and the second electronic unit 22 is attached to the second heat dissipation surface. The first inlet connector 25 and the first outlet connector 26 protrude out from the first side plate 13 and are used for being in communication with the external cooling liquid system. The cooling liquid enters from the first inlet connector 25 and flows out from the first outlet connector 26, such that the first liquid-cooling plate unit 20 carries out liquid-cooling heat dissipation on the first electronic unit 21 and the second electronic unit 22 simultaneously. In the present application, the heat dissipation surface is also referred to as the cooling surface.

Figure 2:
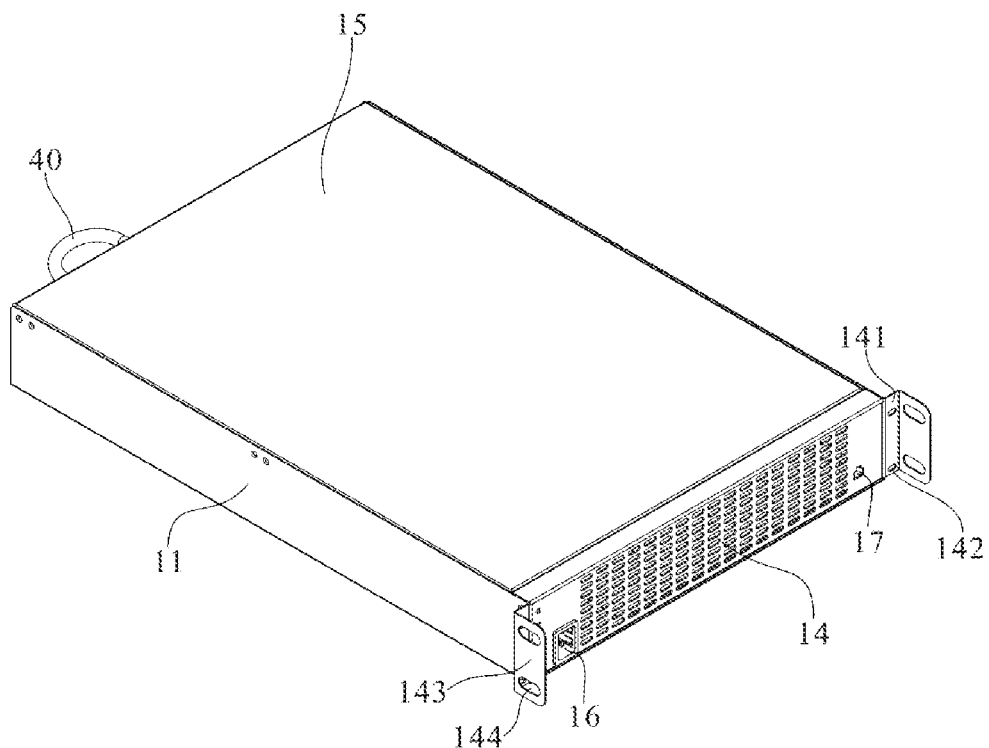
FIG. 2 is a structural schematic diagram of the liquid-cooling heat dissipation apparatus in an embodiment of the present application.
Figure 3:
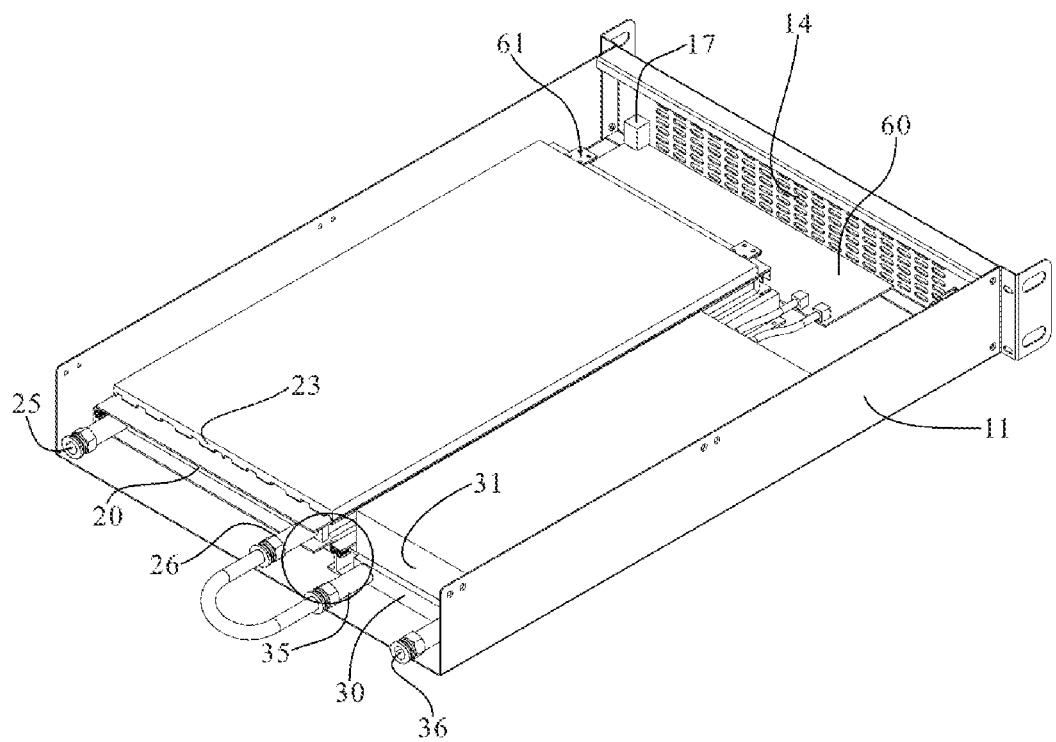
FIG. 3 is a schematic diagram of the internal structure of the housing unit in an embodiment of the present application.

Specifically, with reference to FIGS. 1, 2 and 3, the liquid-cooling heat dissipation apparatus is used for bearing the electronic device and carrying out liquid cooling heat dissipation on the electronic device. The housing unit 10 of the liquid-cooling heat dissipation apparatus has the first side plate 13 and the second side plate 14 that are oppositely arranged. The first liquid-cooling plate unit 20 is arranged in the housing unit 10. The first liquid-cooling plate unit 20 is, e.g., in a plate shape and has two heat dissipation surfaces oppositely arranged, e.g., the first heat dissipation surface and the second heat dissipation surface. The plate-shaped first liquid-cooling plate unit 20 has a cooling liquid flow channel inside for circulating of the cooling liquid, the inlet/outlet connector of the cooling liquid flow channel is located at the same end of the first liquid-cooling plate unit, for example, the first inlet connector 25 and the first outlet connector 26 protrude out from the first side plate 13 of the housing unit 10. The first inlet connector 25 and the first outlet connector 26 are used for being in communication with the external cooling liquid system, and in this way, the cooling liquid enters the first liquid-cooling plate unit from the first inlet connector 25 and flows out from the first outlet connector 26, such that the first liquid-cooling plate unit may carry out liquid-cooling heat dissipation on the electronic devices arranged on the two heat dissipation surfaces.

In an embodiment of the present application, the electronic device includes the first electronic unit 21 and the second electronic unit 22. For example, the first electronic unit 21 and the second electronic unit 22 may be hashboards (or referred to as computing example boards) of the virtual currency mining machine. Alternatively, the first electronic unit 21 and the second electronic unit 22 may also be other heating devices which require liquid-cooling heat dissipation according to actual requirement.

Generally, it may be understood that the electronic device may include the substrate and the heating element located on one surface of the substrate. For example, the substrate is the aluminum substrate, and the heating element is arranged on one surface of the aluminum substrate. Due to reasons of packaging, patching, etc., the thermal resistances of the heating element in upward and downward directions are different in most cases. 80%-90% of the heat generated when the first electronic unit 2210 and the second electronic unit 2220 work is concentrated on the aluminum substrate. In an embodiment of the present application, for example, one surface, which is not provided with the heating element, of the aluminum substrate may be attached to the heat dissipation surface of the first liquid-cooling plate, that is, two electronic devices (e.g., the first electronic unit 21 and the second electronic unit 22) may be arranged on the two heat dissipation surfaces of the first liquid-cooling plate unit 20 in a mirror image manner in the manner that the heating element backs onto the first liquid-cooling plate unit 20, such that most of the heat generated by the heating element is conducted to the first liquid-cooling plate unit 20 by the aluminum substrate, so as to achieve liquid-cooling heat dissipation. Alternatively, according to actual requirement, the two electronic units may be also arranged on the two heat dissipation surfaces of the first liquid-cooling plate unit 20 in a mirror image manner in the manner that the heating element is toward the first liquid-cooling plate unit 20, and in this case, heat generated by the heating elements is directly conducted to the first liquid-cooling plate unit 20, so as to achieve liquid-cooling heat dissipation.

In an embodiment of the present application, the electronic devices, such as the hashboards, are arranged on the two heat dissipation surfaces of the first liquid-cooling plate unit 20, that is, two hashboards are correspondingly arranged on one liquid-cooling plate unit, such that compared with the condition that one hashboard corresponds to one or two liquid-cooling plates in the prior art, the number of liquid-cooling plate units may be greatly reduced under the condition that the number of the hashboards is not changed, such that the number of adapters is greatly reduced, the number of risk points of cooling liquid leakage is further effectively reduced, and the technical effect of greatly reducing the risk of cooling liquid leakage on the premise of ensuring the liquid-cooling heat dissipation effect is achieved.

It may be understood that when there are a plurality of the first liquid-cooling plate units, two electronic devices may be arranged on the two heat dissipation surfaces of each of the first liquid-cooling plate units, and then the plurality of first liquid-cooling plate units may be arranged in parallel via the liquid dispenser/collector apparatus. In this case, it is required to ensure that the plurality of first liquid-cooling plate units need to retain one inlet connector and one outlet connector for the cooling liquid, so as to communicate with the external cooling liquid system.

In a possible implementation, the liquid-cooling heat dissipation apparatus is further used for carrying out liquid-cooling heat dissipation on the power supply device 31. The power supply device 31 is arranged in the housing unit 10, and the power supply device 31 is electrically connected to the above electronic device and is used for supplying power to the electronic device. The power supply device may be also referred to as the power supply. The liquid-cooling heat dissipation apparatus may further include the fourth liquid-cooling plate unit 30 which is fixedly arranged in the housing unit 10, and the fourth liquid-cooling plate unit 30 has the second inlet connector 35 and the second outlet connector 36 that protrude from the first side plate 13. The fourth liquid-cooling plate unit 30 has the third heat dissipation surface to which the power supply device 31 is attached.

The first outlet connector 26 is in communication with the second inlet connector 35 via the adapter pipe 40, and the first inlet connector 25 and the second outlet connector 36 are in communication with the external cooling liquid system. Alternatively, the first inlet connector 25 is in communication with the second outlet connector 36 via the adapter pipe 40, and the first outlet connector 26 and the second inlet connector 35 are in communication with the external cooling liquid system. Alternatively, the first inlet connector 25 and the second inlet connector 35 are each connected to the first three-way connector, the first outlet connector 26 and the second outlet connector 36 are each connected to the second three-way connector, and the first three-way connector and the second three-way connector are in communication with the external cooling liquid system.

Figure 5:
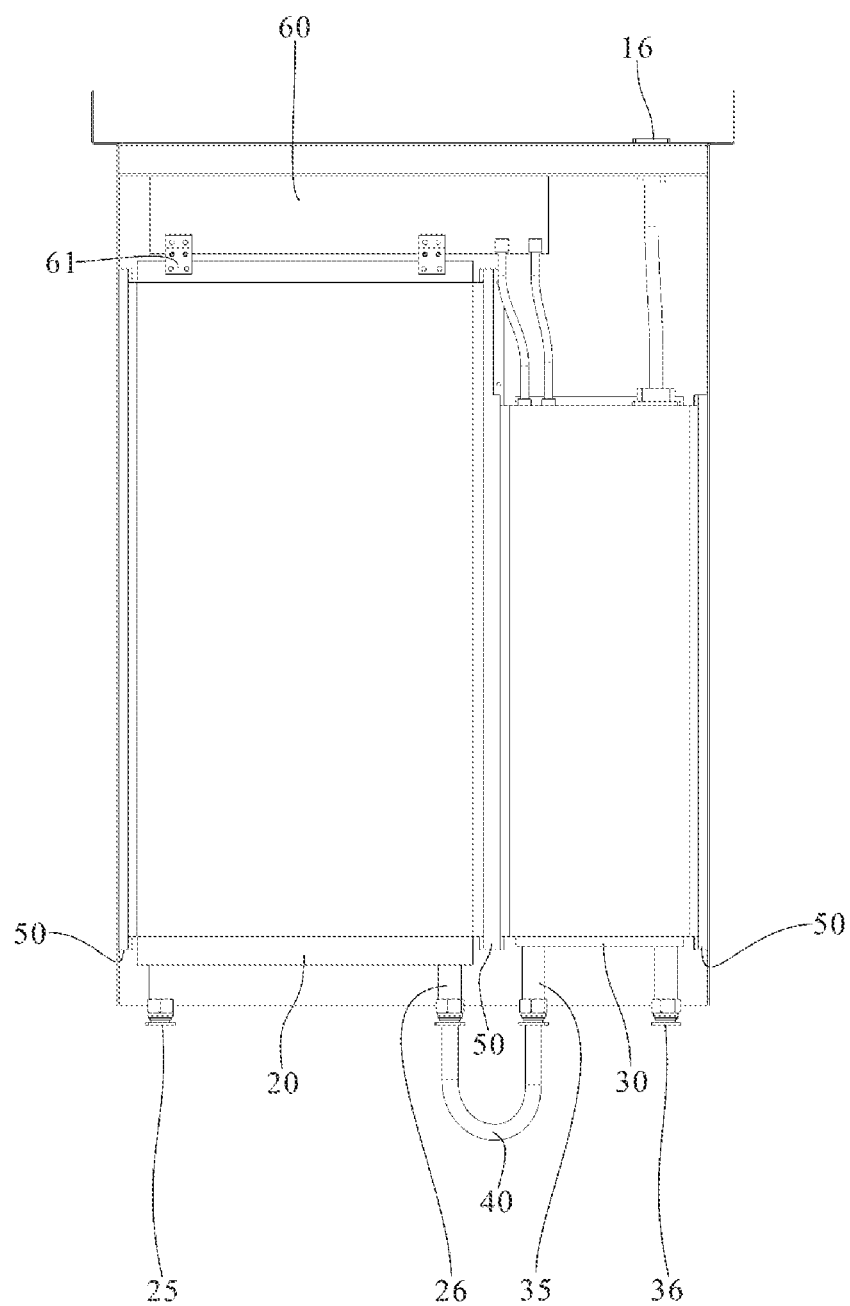
FIG. 5 is a structural schematic diagram of a top view of FIG. 3.

Specifically, in combination with FIGS. 3 and 5, the power supply device 31 is further provided in the housing unit 10 of the liquid-cooling heat dissipation apparatus, and the power supply device 31 is used for supplying power to the above first electronic unit 21 and the second electronic unit 22. In this case, the fourth liquid-cooling plate unit 30 is further provided in the housing unit 10, and one heat dissipation surface (the third heat dissipation surface) of the fourth liquid-cooling plate unit 30 is used for being attached to the power supply device 31, such that the fourth liquid-cooling plate unit 30 is used for carrying out liquid-cooling heat dissipation on the power supply device 31.

With reference to FIG. 5, the first liquid-cooling plate unit 20 may be, for example, in communication with the fourth liquid-cooling plate unit 30 in series. Specifically, the first outlet connector 26 is in communication with the second inlet connector 35 via the adapter pipe 40, such that the cooling liquid flows through the first liquid-cooling plate unit in advance and then flows through the fourth liquid-cooling plate unit. Alternatively, the first inlet connector 25 is in communication with the second outlet connector 36 via the adapter pipe 40, and in this case, the cooling liquid flows through the fourth liquid-cooling plate unit in advance and then flows through the first liquid-cooling plate unit. That is, in an embodiment of the present application, the sequence that the cooling liquid flows through the first liquid-cooling plate unit and the fourth liquid-cooling plate unit for cooling the electronic device and the power supply device may be determined according to the actual requirement.

Alternatively, it may be understood that the first liquid-cooling plate unit 20 and the fourth liquid-cooling plate unit 30 may also be in communication in parallel. Specifically, the first inlet connector 25 and the second inlet connector 35 are each connected to the first three-way connector, meanwhile the first outlet connector 26 and the second outlet connector 36 are each connected to the second three-way connector, and then the first three-way connector and the second three-way connector are in communication with the external cooling liquid system, such that the cooling liquid flows through the first liquid-cooling plate unit and the fourth liquid-cooling plate unit simultaneously.

That is, the first liquid-cooling plate unit 20 and the fourth liquid-cooling plate unit 30 may specifically use the above series communication manner or parallel communication manner according to the actual requirement.

In an embodiment of the present application, the liquid-cooling heat dissipation apparatus may further be used for carrying out liquid-cooling heat dissipation on the power supply device electrically connected to the above electronic device. For example, the electronic device is the hashboard, such that the hashboard and the power supply device form the integral module, which is convenient to be transported and mounted.

In a possible implementation, the liquid-cooling heat dissipation apparatus further includes the connection unit 50, by which the first liquid-cooling plate unit 20 and the fourth liquid-cooling plate unit 30 are fixedly arranged in the housing unit 10 respectively.

In an embodiment of the present application, the first liquid-cooling plate unit and the fourth liquid-cooling plate unit are fixed in the housing unit respectively by the connection unit.

In a possible implementation, adapter flanges 27 are arranged on the two sides of the first liquid-cooling plate unit 20 and the fourth liquid-cooling plate unit 30, the connection units 50 are arranged on the two sides of the first liquid-cooling plate unit 20 and the fourth liquid-cooling plate unit 30 respectively, and the connection unit 50 has the guide groove 51 for the adapter flange 27 to be inserted.

Figure 4:
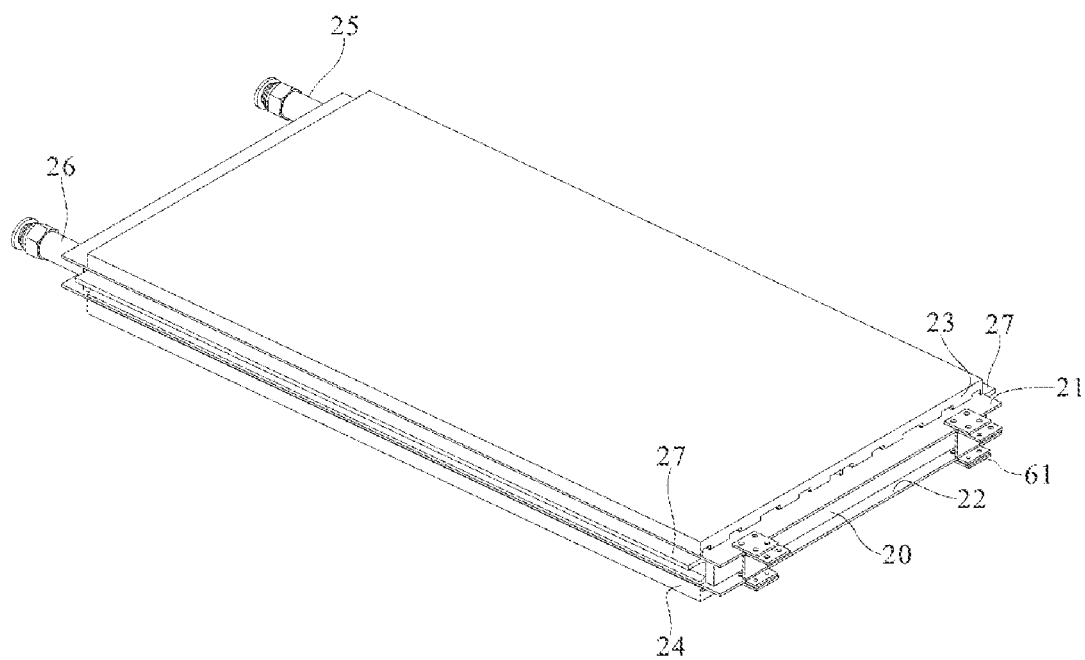
FIG. 4 is a structural schematic diagram of the electronic device attached to the first liquid-cooling plate unit in an embodiment of the present application.

With reference to FIG. 4 for details, the two sides of the first liquid-cooling plate unit 20 have the adapter flanges 27 protruding out from the electronic device. Then with reference to FIGS. 5, 6 and 7, the connection unit 50 has the guide groove 51 for the adapter flange 27 to be inserted, the two connection units 50 are arranged on the two sides of the first liquid-cooling plate unit 20 respectively, and the guide grooves 51 of the two connection units are arranged oppositely, such that the first liquid-cooling plate unit 20 may be inserted into the housing unit 10 along the guide grooves 51. The manner of fixing the fourth liquid-cooling plate unit 30 by the connection unit 50 is similar to that of the first liquid-cooling plate unit, which is not repeated.

In an embodiment of the present application, the first liquid-cooling plate unit and the fourth liquid-cooling plate unit are fixed in the housing unit in a manner of inserting the guide groove. The guide groove has the limiting effect on the two liquid-cooling plate units, and the two liquid-cooling plate units are convenient to be detached.

In a possible implementation, the first liquid-cooling plate unit 20 and the fourth liquid-cooling plate unit 30 are arranged side by side, and the connection unit 50 between the first liquid-cooling plate unit 20 and the fourth liquid-cooling plate unit 30 is integrally arranged.

Figure 6:
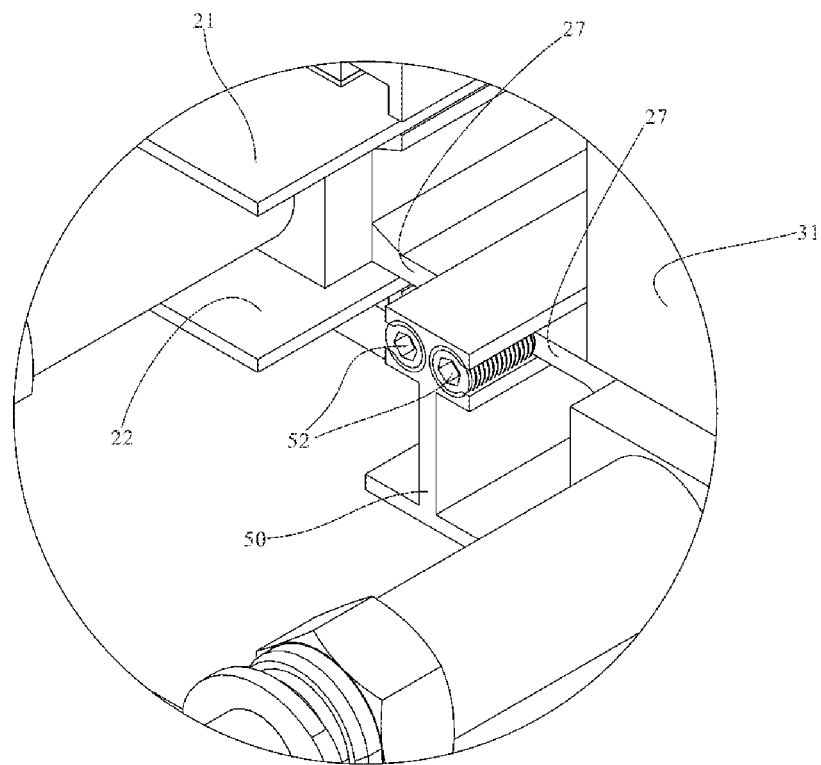
FIG. 6 is a local enlarged diagram of FIG. 3.

With reference to FIG. 6 for details, the first liquid-cooling plate unit 20 and the fourth liquid-cooling plate unit 30 are arranged side by side, such that it may be understood that adjacent connection units 50 between the two liquid-cooling plates may be integrally arranged, that is, the two guide grooves 51 are oppositely and outwardly provided on one adapter.

In a possible implementation, the locking screws 52 are arranged at two ends of the guide groove 51. In this way, after the adapter flanges on the two sides of the first liquid-cooling plate unit and the fourth liquid-cooling plate unit are inserted into the guide grooves, the locking screws 52 are tightened at two ends of the guide grooves 51, the two liquid-cooling plate units may be limited in a direction of the guide grooves 51 to prevent the liquid-cooling plate units from sliding.

Figure 7:
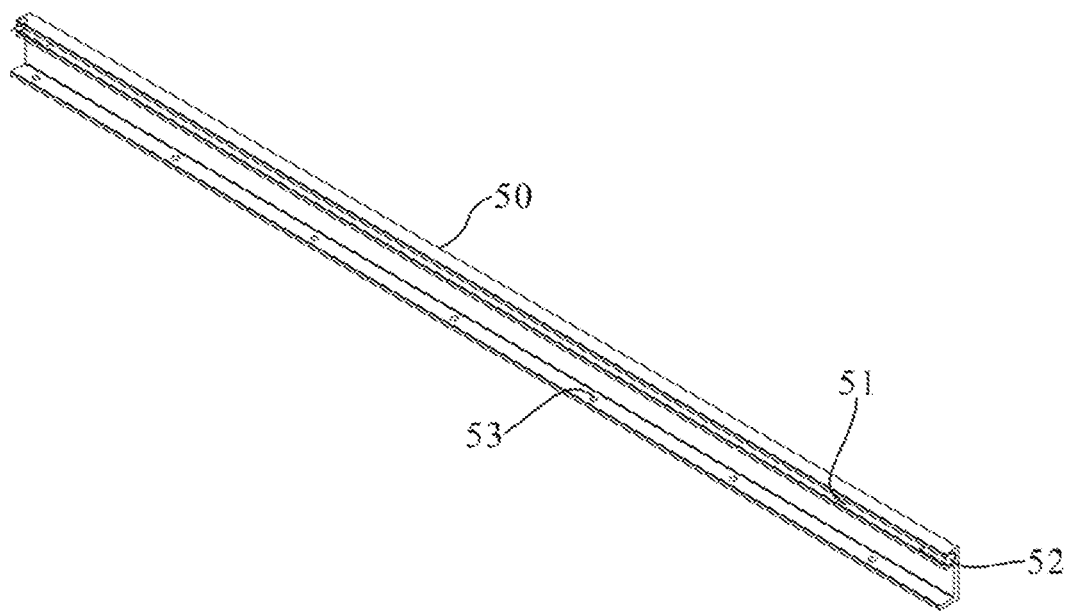
FIG. 7 is a structural schematic diagram of the connection unit in an embodiment of the present application.

In the above embodiment, for example, with reference to FIG. 7, the connection unit 50 may be fixedly mounted on the housing unit 10 by the screw holes 53 provided at the lower bending, and then the above guide groove 51 is located at the upper bending of the connection unit.

In a possible implementation, the housing unit 10 includes the bearing housing 11 which has the bearing groove. The above first side plate 13 and the second side plate 14 are mounted at two ends of the bearing housing 11, and the mounting cover 15 is arranged on the bearing groove. The mounting cover may also be referred to as the case cover plate.

With reference to FIGS. 1-3 for details, the bearing housing 11 is, for example, in a flat plate shape with two ends being bent upwards to form the bearing groove, the above first liquid-cooling plate unit 20 and the fourth liquid-cooling plate unit 30 are fixedly arranged in the bearing groove and are covered by the mounting cover 15 in FIG. 2. The first side plate 13 and the second side plate 14 are packaged at two ends of the bearing groove, wherein the first side plate 13 has the through hole for the liquid-cooling plate inlet/outlet connector protruding out, and then the inlet/outlet connector is in communication with the external cooling liquid system. In this way, the electronic device and the liquid-cooling plate inside the housing unit are separated from the connector of the external cooling liquid system by the first side plate, such that the condition that the electronic device is damaged since the cooling liquid is sprayed to the surface of the electronic device when the inlet/outlet connector of the liquid-cooling plate connected to the external cooling liquid system is plugged and pulled may be effectively prevented.

In a possible implementation, two ends of the second side plate 14 are provided with the power adapter 16 and the communication connector 17 respectively.

The power adapter 16 may be, for example, electrically connected to the power supply device 31 which is electrically connected to the control board 60, and then the electronic device is electrically connected to the control board 60 by the adapter copper bar 61. The communication connector 17 is electrically connected to the control board 60. In this way, the power cable and the communication cable are each connected from two ends of the second side plate 14 to prevent mutual interference between strong electricity and weak electricity, and to facilitate wiring.

On the other hand, in combination with the above embodiment, the cooling liquid connector and the electric connector of the housing unit are arranged on the first side plate and the opposite second side plate respectively to achieve water and power separation and to improve use safety.

In a possible implementation, fixing mounting plates 141 are further protruded and extended from the two ends of the second side plate 14, and the fixing mounting hole 142 is provided on the fixing mounting plate 141. The fixing mounting plate 141 is bent outwards to be provided with the lifting plate 143, and the lifting hole 144 is provided on the lifting plate 143.

With reference to FIG. 2, relative to the bearing housing, the fixing mounting plates 141 are protruded and extended from the two ends of the second side plate 14, and the fixing mounting hole 142 is provided on the fixing mounting plate 141, such that the housing unit 10 may be conveniently and fixedly mounted on the external cabinet by the fixing mounting holes 142. Then, for example, the fixing mounting plates 141 at the two ends are further bent vertically outwards to be provided with the lifting plates 143, and the lifting hole 144 is provided on the lifting plate 143, such that the manual lifting operation is facilitated.

In a possible implementation, one surface of the first electronic unit 21 and one surface of the second electronic unit 22 back onto the liquid-cooling plate are provided with the first protective plate 23 and the second protective plate 24 respectively.

That is, in combination with FIG. 4, on the basis of the above embodiment, the first protective plate 23 and the second protective plate 24 are arranged on the surfaces of the heating elements of the first electronic unit 21 and the second electronic unit 22 respectively, such that the heating elements may be protected.

In a possible implementation, the thermally-conductive silicone grease is provided between the first electronic unit 21 and the first liquid-cooling plate unit 20, and/or the thermally-conductive silicone grease is provided between the second electronic unit 22 and the first liquid-cooling plate unit 20. The thermally-conductive silicone grease is able to facilitate the conduction of heat from the electronic device to the first liquid-cooling plate unit to improve the liquid-cooling effect.

In a possible implementation, the first electronic unit 21 includes the first substrate attached to the first heat dissipation surface, and the second electronic unit 22 includes the second substrate attached to the second heat dissipation surface, wherein the first heat dissipation surface and the second heat dissipation surface are planes, the first substrate and the second substrate are aluminum substrates, and the heating elements are arranged on the surfaces of the aluminum substrates away from the first liquid-cooling plate unit 20.

In an embodiment of the present application, the substrates of the first electronic unit and the second electronic unit are the aluminum substrates, the surfaces of the aluminum substrates providing with the heating elements are arranged backward the first liquid-cooling plate unit, wherein the aluminum substrates are the metal-based copper-clad plates having good heat dissipation function, and the aluminum substrates are attached to the heat dissipation surfaces of the first liquid-cooling plate unit, such that heat generated by the heating elements may be rapidly and efficiently conducted to the first liquid-cooling plate unit, and further conducted to the cooling liquid to achieve rapid and efficient heat dissipation effect.

On the basis of the above embodiment, for example, when the first electronic unit and the second electronic unit are hashboards, the power supply device supplies power to the hashboards. That is, the embodiment of the present application further discloses the liquid-cooling data processing device, such as the virtual currency mining machine. The liquid-cooling virtual currency mining machine includes the hashboard and the liquid-cooling heat dissipation apparatus bearing the hashboard, wherein the liquid-cooling heat dissipation apparatus is the above liquid-cooling heat dissipation apparatus. It may be understood that the virtual currency mining machine herein is only an example, and the electronic device may also be other type of data processing device or the supercomputing server, etc.

An embodiment of the present application provides the liquid-cooling heat dissipation apparatus and the liquid-cooling data processing apparatus. The liquid-cooling heat dissipation apparatus includes the housing unit and the first liquid-cooling plate unit arranged in the housing unit. Then, the first electronic unit and the second electronic unit are arranged on the first heat dissipation surface and the opposite second heat dissipation surface of the first liquid-cooling plate unit respectively, wherein the first electronic unit and the second electronic unit may both be, e.g., the hashboards. That is, in the liquid-cooling heat dissipation apparatus of the present embodiment, one liquid-cooling plate unit is correspondingly provided with two hashboards, such that under the condition that the number of the hashboards is not changed, the number of the liquid-cooling plate units may be greatly reduced, the number of the adapters is greatly reduced, the number of the risk points of cooling liquid leakage is effectively reduced, the technical problem of many risk points of cooling liquid leakage caused when one hashboard corresponds to one or two liquid-cooling plates is solved, and the technical effect of greatly reducing the risk of cooling liquid leakage on the premise of ensuring the liquid-cooling heat dissipation effect is achieved.

In some liquid-cooling heat dissipation technologies, the water cooling radiator is used for cooling the hashboard, and the water cooling plate corresponding to each hashboard is designed in the single process and the single flow direction, such that the flow path of the cooling liquid flowing in the water cooling plate is short, the temperature difference between the cooling liquid and the hashboard is large, the cooling liquid may not effectively carry out heat dissipation on the hashboard, which may result in that the temperature of the hashboard in an area may be not equilibrated, thereby affecting the use performance of the virtual currency mining machine. On this basis, it is necessary to provide the liquid-cooling data processing device, the liquid-cooling heat dissipation apparatus and the temperature equalization method for enhancing the uniformity of heat dissipation aiming at the problem that heat dissipation of the hashboard is not uniform due to the existing water cooling radiator group.

With reference to FIGS. 8-11, an embodiment of the present application provides the liquid-cooling heat dissipation apparatus 100. The liquid-cooling heat dissipation apparatus 100 is applied to the liquid-cooling data processing device such as the virtual currency mining machine, and is used for cooling the first electronic unit 210 and the second electronic unit 220 of the electronic device 200 of the liquid-cooling virtual currency mining machine, so as to ensure the use performance of the liquid-cooling virtual currency mining machine. It may be understood that the liquid-cooling virtual currency mining machine herein may also be other type of data processing device, etc. Certainly, in other implementation of the present application, the liquid-cooling heat dissipation apparatus 100 may also be applied to other electronic device 200 which requires cooling. The liquid-cooling heat dissipation apparatus 100 in the present application applied to the liquid-cooling virtual currency mining machine as an example is described in the present application.

At present, the heat dissipation apparatus in the liquid-cooling virtual currency mining machine usually uses the water cooling radiator, a plurality of the same water cooling radiators are generally arranged in parallel, the hashboards clamped therebetween are arranged in the same direction, which may result in disequilibrium temperature of the hashboards in the area when used, thereby affecting the use performance of the virtual currency mining machine. Therefore, the present application provides the novel liquid-cooling heat dissipation apparatus 100, which may optimize the heat dissipation effect of the electronic device 200, such that the temperature of the electronic device 200 is equilibrium, and the use performance of the liquid-cooling virtual currency mining machine is optimized. The specific structure of the liquid-cooling heat dissipation apparatus 100 is described in detail below.

With reference to FIGS. 8-11, in an embodiment, the liquid-cooling heat dissipation apparatus 100 includes the first liquid-cooling plate 110, and the second liquid-cooling plate 120 and the third liquid-cooling plate 130 symmetrically located on the two sides of the first liquid-cooling plate 110. The symmetry is, for example, vertical symmetry. The first liquid-cooling plate 110 has the first accommodation cavity, and the first liquid inlet/outlet 111 and the second liquid inlet/outlet 112 that are in communication with the first accommodation cavity. The second liquid-cooling plate 120 has the third liquid inlet/outlet 121 and the fourth liquid inlet/outlet 122. The third liquid-cooling plate 130 has the fifth liquid inlet/outlet 131 and the sixth liquid inlet/outlet 132. The first liquid-cooling plate 110 has the first cooling surface and the second cooling surface. The first electronic unit 210 is located between the first liquid-cooling plate 110 and the second liquid-cooling plate 120 and is attached to the first cooling surface of the first liquid-cooling plate 110. The second electronic unit 220 is located between the first liquid-cooling plate 110 and the third liquid-cooling plate 130 and is attached to the second cooling surface of the first liquid-cooling plate 110.

The first liquid-cooling plate 110 is the main cooling structure. The first liquid-cooling plate 110 has the first accommodation cavity, and the first liquid inlet/outlet 111 and the second liquid inlet/outlet 112 in communication with the first accommodation cavity. The first liquid inlet/outlet 111 and the second liquid inlet/outlet 112 are the liquid inlet and the liquid outlet of the first liquid-cooling plate 110. When the first liquid inlet/outlet 111 is the liquid inlet, the second liquid inlet/outlet 112 is the liquid outlet. When the first liquid inlet/outlet 111 is the liquid outlet, the second liquid inlet/outlet 112 is the liquid inlet. After the cooling liquid enters the first accommodation cavity of the first liquid-cooling plate 110, the cooling liquid exchanges heat with the electronic device 200 by the first liquid-cooling plate 110, so as to cool the first electronic unit 210 and the second electronic unit 220 of the electronic device 200.

The first liquid-cooling plate 110 has the cooling surfaces on the two sides, i.e., the first cooling surface and the second cooling surface respectively. The first electronic unit 210 is attached to the first cooling surface, and the second electronic unit 220 is attached to the second cooling surface. The cooling liquid in the first accommodation cavity may exchange heat with the first electronic unit 210 by the first cooling surface to reduce the temperature of the first electronic unit 210, meanwhile may also exchange heat with the second electronic unit 220 by the second cooling surface to reduce the temperature of the second electronic unit 220. In one embodiment, the first liquid-cooling plate 110 has the two-sided symmetric structure; and certainly, in other implementation of the present application, there may also be the difference in structures of the two cooling surfaces of the first liquid-cooling plate 110, as long as the heat dissipation effect is ensured.

In an embodiment of the present application, the first electronic unit 210 and the second electronic unit 220 of the electronic device 200 may be, for example, both the hashboards of the virtual currency mining machine. Alternatively, the first electronic unit 210 and the second electronic unit 220 may also be other heating apparatuses which need liquid-cooling heat dissipation according to actual requirement. It may be understood that the first electronic unit 210 and the second electronic unit 220 each include the substrate and the heating element located on one surface of the substrate. The substrate is, for example, the aluminum substrate, and the heating element is arranged on one surface of the aluminum substrate. It is worth mentioning that for the first electronic unit 210 and the second electronic unit 220 are the hashboards in the present application, the thermal resistances of the chips serving as the heating bodies in the upward and downward directions are different in most cases due to packaging, patching, etc. That is, the surfaces of the first electronic unit 210 and the second electronic unit 220 away from the first liquid-cooling plate 110 may generate corresponding heat.

In order to ensure the working performance of the electronic device 200, the liquid-cooling heat dissipation apparatus 100 of the present application is further provided with the second liquid-cooling plate 120 and the third liquid-cooling plate 130 on the two sides of the first liquid-cooling plate 110. The second liquid-cooling plate 120 is arranged on the surface of the first electronic unit 210 away from the first liquid-cooling plate 110, and the third liquid-cooling plate 130 is arranged on the surface of the second electronic unit 220 away from the first liquid-cooling plate 110. That is, the sandwich structure is formed by the first liquid-cooling plate 110, the second liquid-cooling plate 120 and the third liquid-cooling plate 130, with the first electronic unit 210 and the second electronic unit 220. The first liquid-cooling plate 110 is located in the middlemost, the second liquid-cooling plate 120 and the third liquid-cooling plate 130 are symmetrically arranged on the two sides of the first liquid-cooling plate 110, the first electronic unit 210 is arranged between the first liquid-cooling plate 110 and the second liquid-cooling plate 120, and the second electronic unit 220 is arranged between the first liquid-cooling plate 110 and the third liquid-cooling plate 130.

In this way, the two surfaces of the first electronic unit 210 may be cooled by the first liquid-cooling plate 110 and the second liquid-cooling plate 120, the two surfaces of the second electronic unit 220 may be cooled by the first liquid-cooling plate 110 and the third liquid-cooling plate 130, the cooling effect of the first electronic unit 210 and the second electronic unit 220 may be optimized, and the heat temperatures of the first electronic unit 210 and the second electronic unit 220 are reduced, such that the first electronic unit 210 and the second electronic unit 220 may work more reliably. Moreover, the first electronic unit 210 and the second electronic unit 220 are cooled by the first liquid-cooling plate 110, the second liquid-cooling plate 120 and the third liquid-cooling plate 130 respectively, such that the temperatures of the first electronic unit 210 and the second electronic unit 220 may be more equilibrated.

The second liquid-cooling plate 120 and the third liquid-cooling plate 130 are the auxiliary cooling structures. When the heat dissipation requirement is high, the first liquid-cooling plate 110, the second liquid-cooling plate 120 and the third liquid-cooling plate 130 are used in combination. When the heat dissipation requirement is not high, only the first liquid-cooling plate 110 may be reserved, and the second liquid-cooling plate 120 and the third liquid-cooling plate 130 are omitted. In this way, the production cost may be reduced while the heat dissipation requirement is satisfied.

The second liquid-cooling plate 120 has the second accommodation cavity, and the third liquid inlet/outlet 121 and the fourth liquid inlet/outlet 122 in communication with the second accommodation cavity. The third liquid inlet/outlet 121 and the fourth liquid inlet/outlet 122 may be the liquid inlet and the liquid outlet of the second liquid-cooling plate 120. When the third liquid inlet/outlet 121 is the liquid inlet, the fourth liquid inlet/outlet 122 is the liquid outlet. When the third liquid inlet/outlet 121 is the liquid outlet, the fourth liquid inlet/outlet 122 is the liquid inlet. After the cooling liquid enters the second accommodation cavity of the second liquid-cooling plate 120, the cooling liquid exchanges heat with the electronic device 200 by the second liquid-cooling plate 120, so as to cool the first electronic unit 210 of the electronic device 200. One cooling surface of the second liquid-cooling plate 120 is the third cooling surface which faces the surface of the first electronic unit 210 away from the first liquid-cooling plate 110. The cooling liquid in the second accommodation cavity exchanges heat with the first electronic unit 210 by the third cooling surface to reduce the temperature of the first electronic unit 210.

The third liquid-cooling plate 130 has the third accommodation cavity, and the fifth liquid inlet/outlet 131 and the sixth liquid inlet/outlet 132 in communication with the third accommodation cavity. The fifth liquid inlet/outlet 131 and the sixth liquid inlet/outlet 132 may be the liquid inlet and the liquid outlet of the third liquid-cooling plate 130. When the fifth liquid inlet/outlet 131 is the liquid inlet, the sixth liquid inlet/outlet 132 is the liquid outlet. When the fifth liquid inlet/outlet 131 is the liquid outlet, the sixth liquid inlet/outlet 132 is the liquid inlet. After the cooling liquid enters the third accommodation cavity of the third liquid-cooling plate 130, the cooling liquid exchanges heat with the electronic device 200 by the third liquid-cooling plate 130, so as to cool the second electronic unit 220 of the electronic device 200. One cooling surface of the third liquid-cooling plate 130 is the fourth cooling surface which faces the surface of the second electronic unit 220 away from the first liquid-cooling plate 110. The cooling liquid in the third accommodation cavity exchanges heat with the second electronic unit 220 by the fourth cooling surface to reduce the temperature of the second electronic unit 220.

When the liquid-cooling heat dissipation apparatus 100 of the present application is assembled, the substrates of the first electronic unit 210 and the second electronic unit 220 are attached to the first cooling surface and the second cooling surface of the first liquid-cooling plate 110. The heat generated when the heating elements work may be transferred to the first cooling surface and the second cooling surface by the substrates to achieve liquid-cooling heat dissipation. Moreover, the second liquid-cooling plate 120 may abut against the heating element of the first electronic unit 210 to ensure fixation and heat dissipation of the first electronic unit 210. The third liquid-cooling plate 130 may abut against the heating element of the second electronic unit 220 to ensure fixation and heat dissipation of the second electronic unit 220.

According to the liquid-cooling heat dissipation apparatus 100 of the above embodiments, the first electronic unit 210 and the second electronic unit 220 are symmetrically arranged on the two sides of the first liquid-cooling plate 110, and the second liquid-cooling plate 120 and the third liquid-cooling plate 130 are further arranged on the other side surfaces of the first electronic unit 210 and the second electronic unit 220 respectively. The two surfaces of the first electronic unit 210 are cooled by the first liquid-cooling plate 110 and the second liquid-cooling plate 120, and the two surfaces of the second electronic unit 220 are cooled by the first liquid-cooling plate 110 and the third liquid-cooling plate 130; the problem of non-uniform heat dissipation of the hashboards caused by the existing parallel water-cooling radiator group is effectively solved, and the first liquid-cooling plate 110, the second liquid-cooling plate 120 and the third liquid-cooling plate 130 carry out symmetrical heat dissipation on the two sides of the first electronic unit 210 and the second electronic unit 220 respectively, such that the heat dissipation effect of the first electronic unit 210 and the second electronic unit 220 may be effectively optimized, the temperature between the first electronic unit 210 and the second electronic unit 220 is equilibrated, the temperature difference is avoided, and the use performance of the liquid-cooling virtual currency mining machine is optimized.

In an embodiment, the cooling liquid in the first liquid-cooling plate 110, the second liquid-cooling plate 120 and the third liquid-cooling plate 130 may be cooling water, may also be cooling oil or liquid helium, etc.

In an embodiment, the second liquid-cooling plate 120 has the third cooling surface which has the first fixing protrusion arranged protruded. The first fixing protrusion abuts against the first electronic unit 210. the first heat dissipation channel for heat dissipation of the first electronic unit 210 is enclosed by the surface of the second liquid-cooling plate 120 and the first electronic unit 210. That is, the third cooling surface is the surface of the second liquid-cooling plate 120 towards the first liquid-cooling plate 110, and the first fixing protrusion abuts against the heating element of the first electronic unit 210. The heat generated by the heating element of the first electronic unit 210 is transferred to the second liquid-cooling plate 120 by the first fixing protrusion for cooling. Moreover, the first heat dissipation channel is enclosed between the third cooling surface of the second liquid-cooling plate 120 and the substrate of the first electronic unit 210, heat dissipated when the first electronic unit 210 works exists in the first heat dissipation channel, and the second liquid-cooling plate 120 may exchange heat with the heat in the first heat dissipation channel by the third cooling surface, so as to cool the first electronic unit 210.

In an embodiment, the first fixing protrusion is the protruding structure such as the boss or the protruding column. That is, the third cooling surface of the second liquid-cooling plate 120 is a plane, and the first fixing protrusion is arranged protruding from the third cooling surface. Moreover, the third cooling surface is recessed relative to the first fixing protrusion, such that the higher device may be arranged on the substrate of the first electronic unit 210, and the sufficient mounting space may be ensured.

In an embodiment, the third liquid-cooling plate 130 has the fourth cooling surface which has the second fixing protrusion arranged protruded. The second fixing protrusion abuts against the second electronic unit 220, and the second heat dissipation channel for heat dissipation of the second electronic unit 220 is enclosed by the surface of the third liquid-cooling plate 130 and the second electronic unit 220. That is, the fourth cooling surface is the surface of the third liquid-cooling plate 130 towards the first liquid-cooling plate 110, and the second fixing protrusion abuts against the heating element of the second electronic unit 220. The heat generated by the heating element of the second electronic unit 220 is transferred to the third liquid-cooling plate 130 by the second fixing protrusion for cooling. Moreover, the second heat dissipation channel is enclosed between the fourth cooling surface of the third liquid-cooling plate 130 and the substrate of the second electronic unit 220, heat dissipated when the second electronic unit 220 works exists in the second heat dissipation channel, and the third liquid-cooling plate 130 may exchange heat with the heat in the second heat dissipation channel by the fourth cooling surface to cool the second electronic unit 220.

In an embodiment, the second fixing protrusion is the protruding structure such as the boss or the protruding column. That is, the fourth cooling surface of the third liquid-cooling plate 130 is a plane, and the second fixing protrusion is arranged protruding from the fourth cooling surface. Moreover, the fourth cooling surface is recessed relative to the second fixing protrusion, such that the higher device may be arranged on the substrate of the second electronic unit 220, and the sufficient mounting space may be ensured.

In an embodiment, the liquid-cooling heat dissipation apparatus 100 further includes the connectors. The substrate of the first electronic unit 210 is fixed on the first liquid-cooling plate 110 and the second liquid-cooling plate 120 by the connector, such that the position of the first electronic unit 210 is prevented from shifting. The substrate of the second electronic unit 220 is fixed on the first liquid-cooling plate 110 and the third liquid-cooling plate 130 by the connector, such that the position of the second electronic unit 220 is prevented from shifting.

In an embodiment, the first liquid-cooling plate 110, the second liquid-cooling plate 120 and the third liquid-cooling plate 130 are fixedly connected by the connection structure such as the connector, the connection plate or the connection frame, etc., such that the liquid-cooling heat dissipation apparatus 100 forms the integral module to facilitate later mounting and use.

Figure 8:
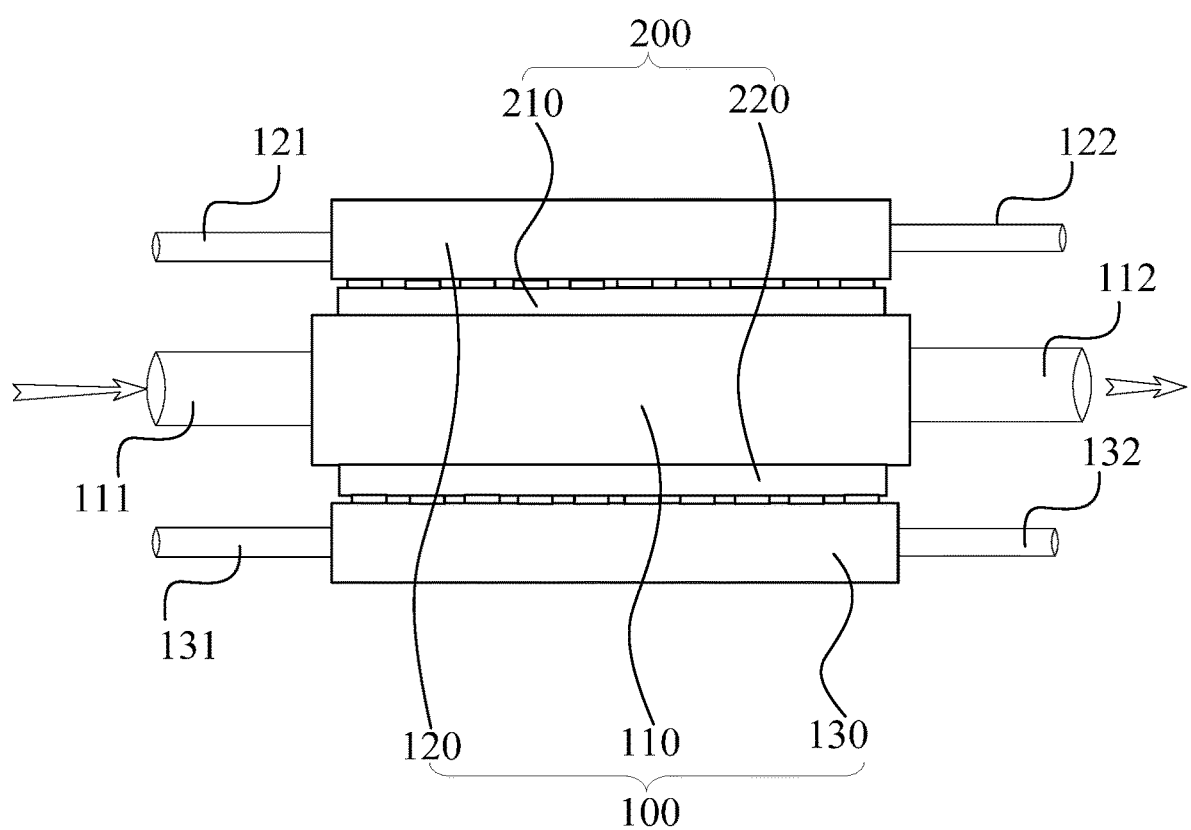
FIG. 8 is a schematic diagram of the liquid-cooling heat dissipation apparatus in an embodiment of the present application.
Figure 9:
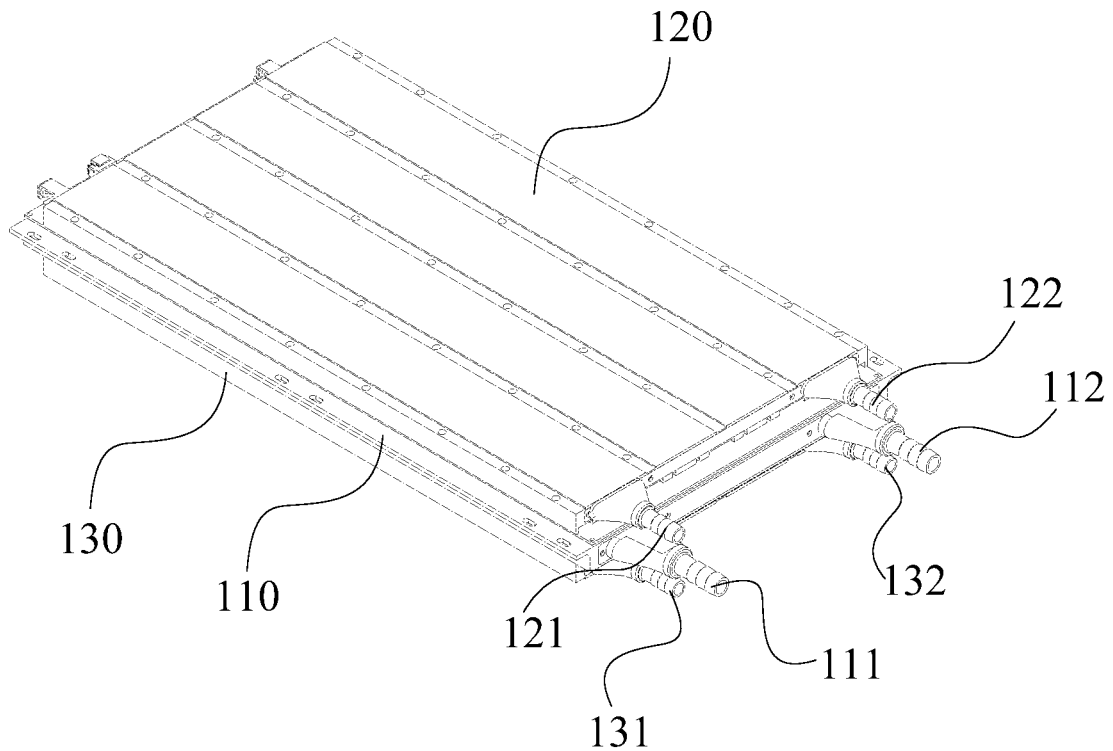
FIG. 9 is a perspective diagram of the liquid-cooling heat dissipation apparatus from a point of view in another embodiment of the present application.

With reference to FIGS. 8 and 9, in an embodiment, the first liquid inlet/outlet 111 and the second liquid inlet/outlet 112 may be provided on the same side or on different sides. The third liquid inlet/outlet 121 and the fourth liquid inlet/outlet 122 may be provided on the same side or on different sides. The fifth liquid inlet/outlet 131 and the sixth liquid inlet/outlet 132 may be provided on the same side or on different sides.

Figure 10:
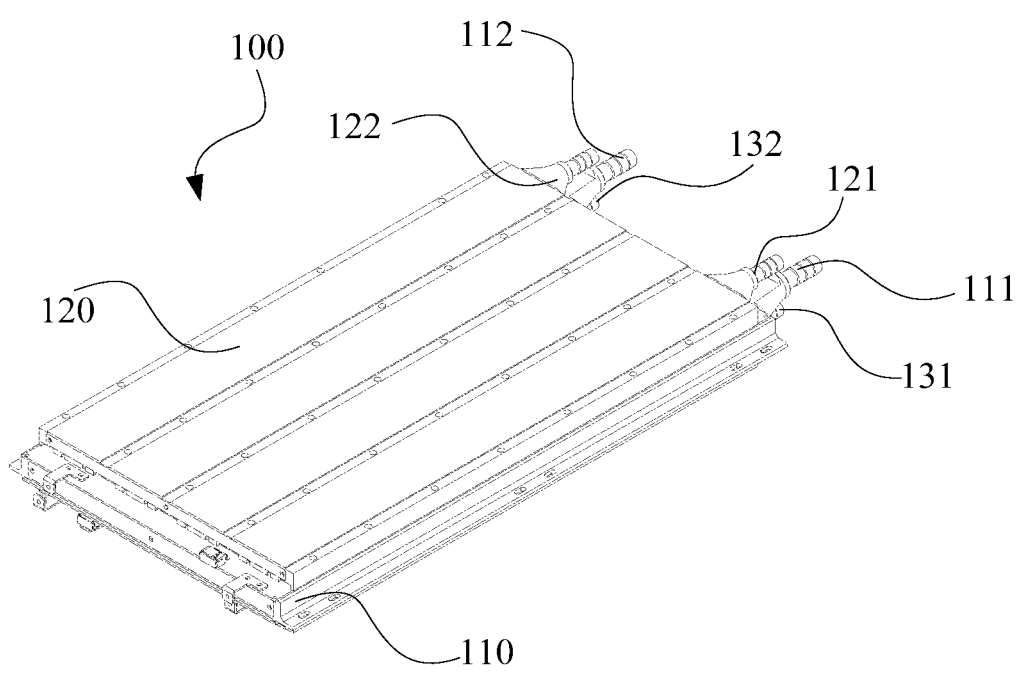
FIG. 10 is a perspective diagram of the liquid-cooling heat dissipation apparatus shown in FIG. 9 from another point of view.
Figure 11:
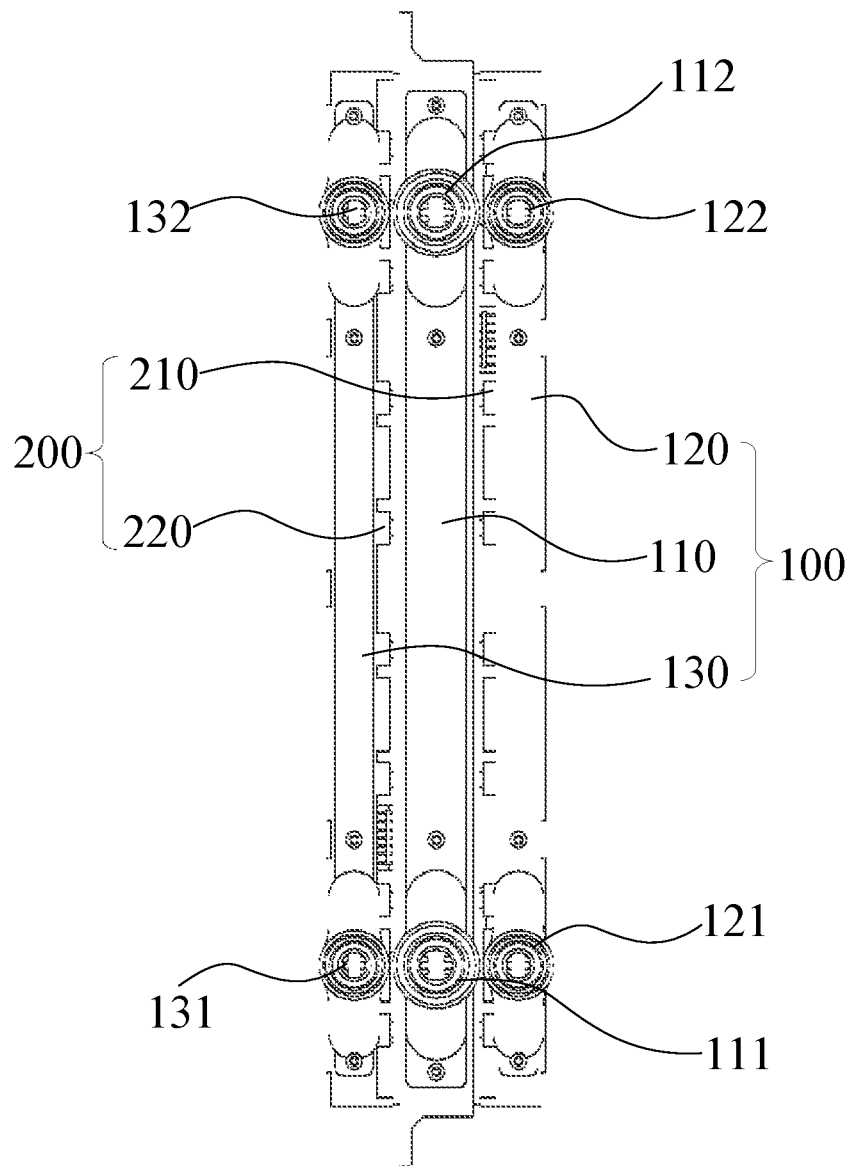
FIG. 11 is a side view of the liquid-cooling heat dissipation apparatus shown in FIG. 9.

It is worth mentioning that the arrangement positions of the first liquid inlet/outlet 111 and the second liquid inlet/outlet 112 are not limited in principle, and the first liquid inlet/outlet and the second liquid inlet/outlet may be provided on the same side or on different sides. Exemplarily, the first liquid inlet/outlet 111 and the second liquid inlet/outlet 112 may be provided on the two sides of the first liquid-cooling plate 110 respectively, as shown in FIG. 8. Certainly, the first liquid inlet/outlet 111 and the second liquid inlet/outlet 112 may be provided on the same side of the first liquid-cooling plate 110, as shown in FIGS. 9-11.

Arrangement positions of the third liquid inlet/outlet 121 and the fourth liquid inlet/outlet 122 are not limited in principle, and the third liquid inlet/outlet and the fourth liquid inlet/outlet may be provided on the same side or on different sides. Exemplarily, the third liquid inlet/outlet 121 and the fourth liquid inlet/outlet 122 may be provided on the two sides of the second liquid-cooling plate 120 respectively, as shown in FIG. 8. Certainly, the third liquid inlet/outlet 121 and the fourth liquid inlet/outlet 122 may be provided on the same side of the second liquid-cooling plate 120, as shown in FIGS. 9-11.

Arrangement positions of the fifth liquid inlet/outlet 131 and the sixth liquid inlet/outlet 132 are not limited in principle, and the fifth liquid inlet/outlet and the sixth liquid inlet/outlet may be provided on the same side or on different sides. Exemplarily, the fifth liquid inlet/outlet 131 and the sixth liquid inlet/outlet 132 may be provided on the two sides of the third liquid-cooling plate 130 respectively, as shown in FIG. 8. Certainly, the fifth liquid inlet/outlet 131 and the sixth liquid inlet/outlet 132 may be provided on the same side of the third liquid-cooling plate 130, as shown in FIGS. 9-11.

It may be understood that the liquid-cooling heat dissipation apparatus 100 is arranged in cooperation with the external cold source, and all the liquid inlet/outlets of the liquid-cooling heat dissipation apparatus 100 may be connected to the external cold source. After the external cold source conveys the cooling liquid to the first liquid-cooling plate 110, the second liquid-cooling plate 120 and the third liquid-cooling plate 130 of the liquid-cooling heat dissipation apparatus 100, the first liquid-cooling plate 110, the second liquid-cooling plate 120 and the third liquid-cooling plate 130 may cool the first electronic unit 210 and the second electronic unit 220. The cooling liquid after cooling flows back to the external cold source, and is pre-cooled by the external cold source, so as to make the cooling liquid circularly flow to reduce the cost.

With reference to FIGS. 8-11, in an embodiment, the first liquid-cooling plate 110, the second liquid-cooling plate 120 and the third liquid-cooling plate 130 are connected in parallel. In this case, the external cold source conveys the cooling liquid into the first liquid-cooling plate 110, the second liquid-cooling plate 120 and the third liquid-cooling plate 130 respectively, so as to cool the first electronic unit 210 and the second electronic unit 220.

In an embodiment, the first liquid inlet/outlet 111, the third liquid inlet/outlet 121 and the fifth liquid inlet/outlet 131 are connected to the liquid outlet end of the external cold source, and the second liquid inlet/outlet 112, the fourth liquid inlet/outlet 122 and the sixth liquid inlet/outlet 132 are connected to the liquid inlet end of the external cold source. The cooling liquid is output by the external cold source through the liquid outlet end, enters the first liquid-cooling plate 110, the second liquid-cooling plate 120 and the third liquid-cooling plate 130 respectively via the first liquid inlet/outlet 111, the third liquid inlet/outlet 121 and the fifth liquid inlet/outlet 131, and then flows back to the external cold source through the liquid inlet end via the corresponding second liquid inlet/outlet 112, the fourth liquid inlet/outlet 122 and the sixth liquid inlet/outlet 132. Certainly, in other implementation of the present application, the first liquid inlet/outlet 111, the third liquid inlet/outlet 121 and the fifth liquid inlet/outlet 131 are connected to the liquid inlet end of the external cold source, and the second liquid inlet/outlet 112, the fourth liquid inlet/outlet 122 and the sixth liquid inlet/outlet 132 are connected to the liquid outlet end of the external cold source.

In an embodiment, the first liquid inlet/outlet 111, the fourth liquid inlet/outlet 122 and the sixth liquid inlet/outlet 132 are connected to the liquid outlet end of the external cold source, and the second liquid inlet/outlet 112, the third liquid inlet/outlet 121 and the fifth liquid inlet/outlet 131 are connected to the liquid inlet end of the external cold source. The cooling liquid is output by the external cold source through the liquid outlet end, enters the first liquid-cooling plate 110, the second liquid-cooling plate 120 and the third liquid-cooling plate 130 respectively via the first liquid inlet/outlet 111, the fourth liquid inlet/outlet 122 and the sixth liquid inlet/outlet 132, and then flows back to the external cold source through the liquid inlet end via the corresponding second liquid inlet/outlet 112, the third liquid inlet/outlet 121 and the fifth liquid inlet/outlet 131. Certainly, in other implementation of the present application, the first liquid inlet/outlet 111, the fourth liquid inlet/outlet 122 and the sixth liquid inlet/outlet 132 may be connected to the liquid inlet end of the external cold source, and the second liquid inlet/outlet 112, the third liquid inlet/outlet 121 and the fifth liquid inlet/outlet 131 may be connected to the liquid outlet end of the external cold source.

In an embodiment, the first liquid-cooling plate 110, the second liquid-cooling plate 120 and the third liquid-cooling plate 130 may be connected in series. In an embodiment, the first liquid-cooling plate 110 is connected to the second liquid-cooling plate 120 in series, which is then connected to the third liquid-cooling plate 130 in series. In this case, the external cold source conveys the cooling liquid to the first liquid-cooling plate 110, the second liquid-cooling plate 120 and the third liquid-cooling plate 130, so as to cool the first electronic unit 210 and the second electronic unit 220. Certainly, in other implementation of the present application, the sequence of the first liquid-cooling plate 110, the second liquid-cooling plate 120 and the third liquid-cooling plate 130 connected in series may be changed. For example, the second liquid-cooling plate 120 is connected to the first liquid-cooling plate 110 in series, which is then connected to the third liquid-cooling plate 130 in series, etc.

In an embodiment, the flow directions of the cooling liquid in the first liquid-cooling plate 110, the second liquid-cooling plate 120 and the third liquid-cooling plate 130 are the same. That is, the first liquid inlet/outlet 111, the third liquid inlet/outlet 121 and the fifth liquid inlet/outlet 131 are connected to the liquid outlet end of the external cold source, and the second liquid inlet/outlet 112, the fourth liquid inlet/outlet 122 and the sixth liquid inlet/outlet 132 are connected to the liquid inlet end of the external cold source.

Certainly, in other implementation of the present application, the first liquid inlet/outlet 111, the third liquid inlet/outlet 121 and the fifth liquid inlet/outlet 131 may be connected to the liquid inlet end of the external cold source, and the second liquid inlet/outlet 112, the fourth liquid inlet/outlet 122 and the sixth liquid inlet/outlet 132 may be connected to the liquid outlet end of the external cold source.

In an embodiment, the flow direction of the cooling liquid in the first liquid-cooling plate 110 is different from those in the second liquid-cooling plate 120 and the third liquid-cooling plate 130. That is, the cooling liquid in the first liquid-cooling plate 110 flows in a direction, and the cooling liquid in the second liquid-cooling plate 120 and the third liquid-cooling plate 130 flows in another direction. Exemplarily, the first liquid inlet/outlet 111, the fourth liquid inlet/outlet 122 and the sixth liquid inlet/outlet 132 are connected to the liquid outlet end of the external cold source, and the second liquid inlet/outlet 112, the third liquid inlet/outlet 121 and the fifth liquid inlet/outlet 131 are connected to the liquid inlet end of the external cold source.

Certainly, in other implementation of the present application, the first liquid inlet/outlet 111, the fourth liquid inlet/outlet 122 and the sixth liquid inlet/outlet 132 may be connected to the liquid inlet end of the external cold source, and the second liquid inlet/outlet 112, the third liquid inlet/outlet 121 and the fifth liquid inlet/outlet 131 may be connected to the liquid outlet end of the external cold source.

In an embodiment, the first liquid-cooling plate 110, the second liquid-cooling plate 120 and the third liquid-cooling plate 130 are connected in series and then connected in parallel. Specifically, the first liquid-cooling plate 110 is connected to the second liquid-cooling plate 120 and the third liquid-cooling plate 130 in series respectively, and the second liquid-cooling plate 120 is connected to the third liquid-cooling plate 130 in parallel. In this case, the external cold source conveys the cooling liquid to the first liquid-cooling plate 110, so as to cool one surface of the first electronic unit 210 and one surface of the second electronic unit 220. The cooling liquid flowing out from the first liquid-cooling plate 110 flows into the second liquid-cooling plate 120 and the third liquid-cooling plate 130 respectively, so as to cool the other surface of the first electronic unit 210 and the other surface of the second electronic unit 220.

Exemplarily, the first liquid inlet/outlet 111 is connected to the liquid outlet end of the external cold source, the second liquid inlet/outlet 112 is connected to the third liquid inlet/outlet 121 and the fifth liquid inlet/outlet 131 respectively, and the fourth liquid inlet/outlet 122 and the sixth liquid inlet/outlet 132 are each connected to the liquid inlet end of the external cold source. The cooling liquid of the external cold source enters the first liquid-cooling plate 110 through the liquid outlet end and the first liquid inlet/outlet 111. After the cooling liquid in the first liquid-cooling plate 110 cools the first electronic unit 210 and the second electronic unit 220, the cooling liquid flows out from the second liquid inlet/outlet 112, enters the second liquid-cooling plate 120 and the third liquid-cooling plate 130 respectively via the third liquid inlet/outlet 121 and the fifth liquid inlet/outlet 131, cools the first electronic unit 210 and the second electronic unit 220 again, and flows back to the external cold source through the liquid inlet end from the fourth liquid inlet/outlet 122 and the sixth liquid inlet/outlet 132.

Certainly, in other implementation of the present application, the first liquid inlet/outlet 111 is connected to the liquid outlet end of the external cold source, the second liquid inlet/outlet 112 is connected to the fourth liquid inlet/outlet 122 and the sixth liquid inlet/outlet 132 respectively, and the third liquid inlet/outlet 121 and the fifth liquid inlet/outlet 131 are each connected to the liquid inlet end of the external cold source.

The present application further provides the temperature equalization method for the liquid-cooling heat dissipation apparatus 100. The temperature equalization method is applied to the liquid-cooling heat dissipation apparatus 100. The liquid-cooling heat dissipation apparatus 100 includes the first liquid-cooling plate 110, and the second liquid-cooling plate 120 and the third liquid-cooling plate 130 located on the two sides of the first liquid-cooling plate 110. The first liquid-cooling plate 110 has the first cooling surface and the second cooling surface. The first electronic unit 210 is located between the first liquid-cooling plate 110 and the second liquid-cooling plate 120 and is attached to the first cooling surface of the first liquid-cooling plate 110. The second electronic unit 220 is located between the first liquid-cooling plate 110 and the third liquid-cooling plate 130 and is attached to the second cooling surface of the first liquid-cooling plate 110.

The temperature equalization method includes the following steps:
controlling the first liquid-cooling plate 110, the second liquid-cooling plate 120 and the third liquid-cooling plate 130 to be connected in series and/or in parallel;
controlling the external cold source to convey the cooling liquid to the first liquid-cooling plate 110, the second liquid-cooling plate 120 and the third liquid-cooling plate 130; and
cooling, by the first liquid-cooling plate 110, the second liquid-cooling plate 120 and the third liquid-cooling plate 130, the first electronic unit 210 and the second electronic unit 220 respectively.

It may be understood that the liquid-cooling heat dissipation apparatus 100 further includes the controller. The controller is electrically connected to the external cold source and is used for controlling the external cold source to convey cooling liquid to the first liquid-cooling plate 110, the second liquid-cooling plate 120 and the third liquid-cooling plate 130. It is worth mentioning that the series-parallel connection manner of the corresponding liquid-cooling heat dissipation apparatus 100 may be arranged in advance according to the operation capacity of the liquid-cooling virtual currency mining machine, and specifically, is implemented by different connection manners of the cooling pipelines. Different connection manners of the cooling pipelines may make the first liquid-cooling plate 110, the second liquid-cooling plate 120 and the third liquid-cooling plate 130 form different connection manners. Exemplarily, the first liquid-cooling plate 110, the second liquid-cooling plate 120 and the third liquid-cooling plate 130 may be connected in parallel, in series and then in parallel, or in parallel and then in series via the cooling pipelines. For example, the first liquid-cooling plate 110 is connected to the second liquid-cooling plate 120 in series, which is then connected to the third liquid-cooling plate 130 in parallel. For another example, the second liquid-cooling plate 120 is connected to the third liquid-cooling plate 130 in parallel, which is then connected to the first liquid-cooling plate 110 in series, etc. Certainly, the first liquid-cooling plate 110, the second liquid-cooling plate 120 and the third liquid-cooling plate 130 may also be connected in series. For example, the first liquid-cooling plate 110, the second liquid-cooling plate 120 and the third liquid-cooling plate 130 are connected directly in series, etc, or the series connection sequence of each liquid-cooling plate may be adjusted according to the actual working condition. For example, the second liquid-cooling plate 120 is connected to the first liquid-cooling plate 110 in series, which is then connected to the third liquid-cooling plate 130 in series, etc.

After the connection of the first liquid-cooling plate 110, the second liquid-cooling plate 120 and the third liquid-cooling plate 130 is completed, the controller controls the external cold source to convey the cooling liquid, and the first electronic unit 210 and the second electronic unit 220 are cooled by the first liquid-cooling plate 110, the second liquid-cooling plate 120 and the third liquid-cooling plate 130 respectively to optimize the heat dissipation effect of the first electronic unit 210 and the second electronic unit 220, such that the temperature between the first electronic unit 210 and the second electronic unit 220 is equilibrated, the temperature difference is avoided, and the use performance of the liquid-cooling virtual currency mining machine is optimized.

In an embodiment, the first liquid-cooling plate 110 has the first accommodation cavity, and the first liquid inlet/outlet 111 and the second liquid inlet/outlet 112 in communication with the first accommodation cavity. The second liquid-cooling plate 120 has the second accommodation cavity, and the third liquid inlet/outlet 121 and the fourth liquid inlet/outlet 122 in communication with the second accommodation cavity. The third liquid-cooling plate 130 has the third accommodation cavity, and the fifth liquid inlet/outlet 131 and the sixth liquid inlet/outlet 132 in communication with the third accommodation cavity.

The step of controlling the first liquid-cooling plate 110, the second liquid-cooling plate 120 and the third liquid-cooling plate 130 to be connected in series and/or in parallel includes:

controlling one of the first liquid inlet/outlet 111 and the second liquid inlet/outlet 112 to be connected to the liquid outlet end of the external cold source, and the other one to be connected to the liquid inlet end of the external cold source;

controlling one of the third liquid inlet/outlet 121 and the fourth liquid inlet/outlet 122 to be connected to the liquid outlet end of the external cold source, and the other one to be connected to the liquid inlet end of the external cold source; and controlling one of the fifth liquid inlet/outlet 131 and the sixth liquid inlet/outlet 132 to be connected to the liquid outlet end of the external cold source, and the other one to be connected to the liquid inlet end of the external cold source.

The first liquid-cooling plate 110, the second liquid-cooling plate 120 and the third liquid-cooling plate 130 are connected in parallel. In this case, the external cold source conveys the cooling liquid to the first liquid-cooling plate 110, the second liquid-cooling plate 120 and the third liquid-cooling plate 130 respectively, so as to cool the first electronic unit 210 and the second electronic unit 220. When the first liquid-cooling plate 110, the second liquid-cooling plate 120 and the third liquid-cooling plate 130 are connected in parallel, one of the first liquid inlet/outlet 111 and the second liquid inlet/outlet 112 is the liquid outlet, the other one is the liquid inlet, one of the third liquid inlet/outlet 121 and the fourth liquid inlet/outlet 122 is the liquid inlet, the other one is the liquid outlet, one of the fifth liquid inlet/outlet 131 and the sixth liquid inlet/outlet 132 is the liquid inlet, and the other is the liquid outlet. It is ensured that the cooling liquid in the first liquid-cooling plate 110, the second liquid-cooling plate 120 and the third liquid-cooling plate 130 are independent of one another, and mixed flowing may not occur.

Exemplarily, the first liquid inlet/outlet 111, the third liquid inlet/outlet 121 and the fifth liquid inlet/outlet 131 are connected to the liquid outlet end of the external cold source, and the second liquid inlet/outlet 112, the fourth liquid inlet/outlet 122 and the sixth liquid inlet/outlet 132 are connected to the liquid inlet end of the external cold source. The cooling liquid is output by the external cold source through the liquid outlet end, enters the first liquid-cooling plate 110, the second liquid-cooling plate 120 and the third liquid-cooling plate 130 respectively via the first liquid inlet/outlet 111, the third liquid inlet/outlet 121 and the fifth liquid inlet/outlet 131, and then flows back to the external cold source through the liquid inlet end via the corresponding second liquid inlet/outlet 112, the fourth liquid inlet/outlet 122 and the sixth liquid inlet/outlet 132. Certainly, in other implementation of the present application, the first liquid inlet/outlet 111, the third liquid inlet/outlet 121 and the fifth liquid inlet/outlet 131 are connected to the liquid inlet end of the external cold source, and the second liquid inlet/outlet 112, the fourth liquid inlet/outlet 122 and the sixth liquid inlet/outlet 132 are connected to the liquid outlet end of the external cold source.

Exemplarily, the first liquid inlet/outlet 111, the fourth liquid inlet/outlet 122 and the sixth liquid inlet/outlet 132 are connected to the liquid outlet end of the external cold source, and the second liquid inlet/outlet 112, the third liquid inlet/outlet 121 and the fifth liquid inlet/outlet 131 are connected to the liquid inlet end of the external cold source. The cooling liquid is output by the external cold source through the liquid outlet end, enters the first liquid-cooling plate 110, the second liquid-cooling plate 120 and the third liquid-cooling plate 130 respectively via the first liquid inlet/outlet 111, the fourth liquid inlet/outlet 122 and the sixth liquid inlet/outlet 132, and then flows back to the external cold source through the liquid inlet end via the corresponding second liquid inlet/outlet 112, the third liquid inlet/outlet 121 and the fifth liquid inlet/outlet 131. Certainly, in other implementation of the present application, the first liquid inlet/outlet 111, the fourth liquid inlet/outlet 122 and the sixth liquid inlet/outlet 132 may be connected to the liquid inlet end of the external cold source, and the second liquid inlet/outlet 112, the third liquid inlet/outlet 121 and the fifth liquid inlet/outlet 131 may be connected to the liquid outlet end of the external cold source.

In an embodiment, the step of controlling the first liquid-cooling plate 110, the second liquid-cooling plate 120 and the third liquid-cooling plate 130 to be connected in series and/or in parallel includes:

controlling the first liquid-cooling plate 110 to be connected to the second liquid-cooling plate 120 and the third liquid-cooling plate 130 in series respectively;

controlling the external cold source to convey the cooling liquid to the first liquid-cooling plate 110, so as to cool one surface of the first electronic unit 210 and one surface of the second electronic unit 220; and controlling the cooling liquid flowing out from the first liquid-cooling plate 110 to flow into the second liquid-cooling plate 120 and the third liquid-cooling plate 130 respectively, so as to cool the other surface of the first electronic unit 210 and the other surface of the second electronic unit 220.

The first liquid-cooling plate 110, the second liquid-cooling plate 120 and the third liquid-cooling plate 130 are connected in series and then connected in parallel. Specifically, the first liquid-cooling plate 110 is connected to the second liquid-cooling plate 120 and the third liquid-cooling plate 130 in series respectively, and the second liquid-cooling plate 120 is connected to the third liquid-cooling plate 130 in parallel. In this case, the external cold source conveys the cooling liquid to the first liquid-cooling plate 110, so as to cool one surface of the first electronic unit 210 and one surface of the second electronic unit 220. The cooling liquid flowing out from the first liquid-cooling plate 110 flows into the second liquid-cooling plate 120 and the third liquid-cooling plate 130 respectively, so as to cool the other surface of the first electronic unit 210 and the other surface of the second electronic unit 220. By connecting the first liquid-cooling plate 110 in middle to the second liquid-cooling plate 120 and the third liquid-cooling plate 130 on the two sides in series, the cooling requirement of the first electronic unit 210 and the second electronic unit 220 may be better satisfied and the temperature equalization of the first electronic unit 210 and the second electronic unit 220 is promoted.

In an embodiment, the first liquid-cooling plate 110 has the first accommodation cavity, and the first liquid inlet/outlet 111 and the second liquid inlet/outlet 112 in communication with the first accommodation cavity. The second liquid-cooling plate 120 has the second accommodation cavity, and the third liquid inlet/outlet 121 and the fourth liquid inlet/outlet 122 in communication with the second accommodation cavity. The third liquid-cooling plate 130 has the third accommodation cavity, and the fifth liquid inlet/outlet 131 and the sixth liquid inlet/outlet 132 in communication with the third accommodation cavity.

The step of controlling the first liquid-cooling plate 110 to be connected to the second liquid-cooling plate 120 and the third liquid-cooling plate 130 in series respectively includes:

controlling the second liquid inlet/outlet 112 to be connected to the third liquid inlet/outlet 121 and the fifth liquid inlet/outlet 131 respectively, so as to make the cooling liquid in the first liquid-cooling plate 110 enter the second liquid-cooling plate 120 via the second liquid inlet/outlet 112 and the third liquid inlet/outlet 121, and make the cooling liquid in the first liquid-cooling plate 110 enter the third liquid-cooling plate 130 via the second liquid inlet/outlet 112 and the fifth liquid inlet/outlet 131;

alternatively, controlling the second liquid inlet/outlet 112 to be connected to the fourth liquid inlet/outlet 122 and the sixth liquid inlet/outlet 132 respectively, so as to make the cooling liquid in the first liquid-cooling plate 110 enter the second liquid-cooling plate 120 via the second liquid inlet/outlet 112 and the fourth liquid inlet/outlet 122, and make the cooling liquid in the first liquid-cooling plate 110 enter the third liquid-cooling plate 130 via the second liquid inlet/outlet 112 and the sixth liquid inlet/outlet 132.

Exemplarily, the first liquid inlet/outlet 111 is connected to the liquid outlet end of the external cold source, the second liquid inlet/outlet 112 is connected to the third liquid inlet/outlet 121 and the fifth liquid inlet/outlet 131 respectively, and the fourth liquid inlet/outlet 122 and the sixth liquid inlet/outlet 132 are each connected to the liquid inlet end of the external cold source. The cooling liquid in the external cold source enters the first liquid-cooling plate 110 through the liquid outlet end and the first liquid inlet/outlet 111. After the cooling liquid in the first liquid-cooling plate 110 cools the first electronic unit 210 and the second electronic unit 220, the cooling liquid flows out from the second liquid inlet/outlet 112, enters the second liquid-cooling plate 120 and the third liquid-cooling plate 130 via the third liquid inlet/outlet 121 and the fifth liquid inlet/outlet 131 respectively, then cools the first electronic unit 210 and the second electronic unit 220, and flows back to the external cold source through the liquid inlet end from the fourth liquid inlet/outlet 122 and the sixth liquid inlet/outlet 132.

Certainly, in other implementation of the present application, the first liquid inlet/outlet 111 is connected to the liquid outlet end of the external cold source, the second liquid inlet/outlet 112 is connected to the fourth liquid inlet/outlet 122 and the sixth liquid inlet/outlet 132 respectively, and the third liquid inlet/outlet 121 and the fifth liquid inlet/outlet 131 are each connected to the liquid inlet end of the external cold source. The cooling liquid of the external cold source enters the first liquid-cooling plate 110 through the liquid outlet end and the first liquid inlet/outlet 111. After the cooling liquid in the first liquid-cooling plate 110 cools the first electronic unit 210 and the second electronic unit 220, the cooling liquid flows out from the second liquid inlet/outlet 112, enters the second liquid-cooling plate 120 and the third liquid-cooling plate 130 via the fourth liquid inlet/outlet 122 and the sixth liquid inlet/outlet 132 respectively, then cools the first electronic unit 210 and the second electronic unit 220, and flows back to the external cold source through the liquid inlet end from the third liquid inlet/outlet 121 and the fifth liquid inlet/outlet 131.

In an embodiment, the step of controlling the first liquid-cooling plate 110, the second liquid-cooling plate 120 and the third liquid-cooling plate 130 to be connected in series and/or in parallel includes:

controlling the second liquid-cooling plate 120 to be connected to the third liquid-cooling plate 130 in parallel, which is then connected to the first liquid-cooling plate 110 in series;

controlling the external cold source to convey the cooling liquid to the second liquid-cooling plate 120 and the third liquid-cooling plate 130, so as to cool the other surface of the first electronic unit 210 and the other surface of the second electronic unit 220; and controlling the cooling liquid flowing out from the second liquid-cooling plate 120 and the third liquid-cooling plate 130 to enter the first liquid-cooling plate 110 respectively, so as to cool one surface of the first electronic unit 210 and one surface of the second electronic unit 220.

The first liquid-cooling plate 110, the second liquid-cooling plate 120 and the third liquid-cooling plate 130 are connected in parallel and then connected in series. Specifically, the second liquid-cooling plate 120 is connected to the third liquid-cooling plate 130 in parallel, which is then connected to the first liquid-cooling plate 110 in series. In this case, the external cold source conveys the cooling liquid to the second liquid-cooling plate 120 and the third liquid-cooling plate 130, so as to cool a surface of the first electronic unit 210 and a surface of the second electronic unit 220. The cooling liquid flowing out from the second liquid-cooling plate 120 and the third liquid-cooling plate 130 flows into the first liquid-cooling plate 110 respectively, so as to cool the other surface of the first electronic unit 210 and the other surface of the second electronic unit 220. By connecting the second liquid-cooling plate 120 and the third liquid-cooling plate 130 on the two sides in parallel and then connecting the first liquid-cooling plate 110 in middle in series, the cooling requirement of the first electronic unit 210 and the second electronic unit 220 may be better satisfied and temperature equalization of the first electronic unit 210 and the second electronic unit 220 is promoted.

In an embodiment, the first liquid-cooling plate 110 has the first accommodation cavity, and the first liquid inlet/outlet 111 and the second liquid inlet/outlet 112 in communication with the first accommodation cavity. The second liquid-cooling plate 120 has the second accommodation cavity, and the third liquid inlet/outlet 121 and the fourth liquid inlet/outlet 122 in communication with the second accommodation cavity. The third liquid-cooling plate 130 has the third accommodation cavity, and the fifth liquid inlet/outlet 131 and the sixth liquid inlet/outlet 132 in communication with the third accommodation cavity.

The step of controlling the second liquid-cooling plate 120 to be connected to the third liquid-cooling plate 130 in parallel and then to be connected to the first liquid-cooling plate 110 in series includes:

controlling the third liquid inlet/outlet 121 and the fifth liquid inlet/outlet 131 to be connected to the second liquid inlet/outlet 112 respectively, so as to make the cooling liquid in the second liquid-cooling plate 120 enter the first liquid-cooling plate 110 through the third liquid inlet/outlet 121 and the second liquid inlet/outlet 112 and make the cooling liquid in the third liquid-cooling plate 130 enter the first liquid-cooling plate 110 via the fifth liquid inlet/outlet 131 and the second liquid inlet/outlet 112;

alternatively, controlling the fourth liquid inlet/outlet 122 and the sixth liquid inlet/outlet 132 to be connected to the second liquid inlet/outlet 112 respectively, so as to make the cooling liquid in the second liquid-cooling plate 120 enter the first liquid-cooling plate 110 via the fourth liquid inlet/outlet 122 and the second liquid inlet/outlet 112, and make the cooling liquid in the third liquid-cooling plate 130 enter the first liquid-cooling plate 110 via the sixth liquid inlet/outlet 132 and the second liquid inlet/outlet 112.

Exemplarily, the fourth liquid inlet/outlet 122 and the sixth liquid inlet/outlet 132 are each connected to the liquid outlet end of the external cold source, the third liquid inlet/outlet 121 and the fifth liquid inlet/outlet 131 are each connected to the first liquid inlet/outlet 111, and the second liquid inlet/outlet 112 is connected to the liquid inlet end of the external cold source. The cooling liquid in the external cold source enters the second liquid-cooling plate 120 and the third liquid-cooling plate 130 through the liquid outlet end, and the fourth liquid inlet/outlet 122 and the sixth liquid inlet/outlet 132 respectively. After the cooling liquid in the second liquid-cooling plate 120 and the third liquid-cooling plate 130 cools the first electronic unit 210 and the second electronic unit 220, the cooling liquid flows out from the third liquid inlet/outlet 121 and the fifth liquid inlet/outlet 131, enters the first liquid-cooling plate 110 via the second liquid inlet/outlet 112, cools the first electronic unit 210 and the second electronic unit 220 again, and flows back to the external cold source from the first liquid inlet/outlet 111 through the liquid inlet end. In other implementation of the present application, after the cooling liquid in the second liquid-cooling plate 120 and the third liquid-cooling plate 130 cools the first electronic unit 210 and the second electronic unit 220, the cooling liquid flows out from the third liquid inlet/outlet 121 and the fifth liquid inlet/outlet 131, enters the first liquid-cooling plate 110 via the first liquid inlet/outlet 111, cools the first electronic unit 210 and the second electronic unit 220 again, and flows back to the external cold source from the second liquid inlet/outlet 112 through the liquid inlet end.

Certainly, in other implementation of the present application, the third liquid inlet/outlet 121 and the fifth liquid inlet/outlet 131 are each connected to the liquid outlet end of the external cold source, the fourth liquid inlet/outlet 122 and the sixth liquid inlet/outlet 132 are each connected to the first liquid inlet/outlet 111, and the second liquid inlet/outlet 112 is connected to the liquid inlet end of the external cold source. The cooling liquid of the external cold source enters the second liquid-cooling plate 120 and the third liquid-cooling plate 130 through the liquid outlet end, and the third liquid inlet/outlet 121 and the fifth liquid inlet/outlet 131 respectively, and after the cooling liquid in the second liquid-cooling plate 120 and the third liquid-cooling plate 130 cools the first electronic unit 210 and the second electronic unit 220, the cooling liquid flows out from the fourth liquid inlet/outlet 122 and the sixth liquid inlet/outlet 132, and enters the first liquid-cooling plate 110 via the first liquid inlet/outlet 111. After the cooling liquid in the first liquid-cooling plate 110 cools the first electronic unit 210 and the second electronic unit 220, the cooling liquid flows out from the second liquid inlet/outlet 112, and flows back to the external cold source through the liquid inlet end. In other implementation of the present application, after the cooling liquid in the second liquid-cooling plate 120 and the third liquid-cooling plate 130 cools the first electronic unit 210 and the second electronic unit 220, the cooling liquid flows out from the fourth liquid inlet/outlet 122 and the sixth liquid inlet/outlet 132, and enters the first liquid-cooling plate 110 via the second liquid inlet/outlet 112. After the cooling liquid in the first liquid-cooling plate 110 cools the first electronic unit 210 and the second electronic unit 220, the cooling liquid flows out from the first liquid inlet/outlet 111 and flows back to the external cold source through the liquid inlet end.

In an embodiment, the temperature equalization method further includes the following steps:

controlling the flow direction of the cooling liquid in the first liquid-cooling plate 110 to be the same as that in the second liquid-cooling plate 120 and to be the same as that in the third liquid-cooling plate 130;

alternatively, controlling the flow direction of the cooling liquid in the first liquid-cooling plate 110 to be opposite that in the second liquid-cooling plate 120 and to be opposite that in the third liquid-cooling plate 130;

alternatively, controlling the flow direction of the cooling liquid in the first liquid-cooling plate 110 to be the same as that in one of the second liquid-cooling plate 120 and the third liquid-cooling plate 130, and to be opposite that in the other one of the second liquid-cooling plate 120 and the third liquid-cooling plate 130.

The flow direction of the cooling liquid in the first liquid-cooling plate 110, in the second liquid-cooling plate 120 and in the third liquid-cooling plate 130 are the same. That is, the first liquid inlet/outlet 111, the third liquid inlet/outlet 121 and the fifth liquid inlet/outlet 131 are connected to the liquid outlet end of the external cold source, and the second liquid inlet/outlet 112, the fourth liquid inlet/outlet 122 and the sixth liquid inlet/outlet 132 are connected to the liquid inlet end of the external cold source. Certainly, in other implementation of the present application, the first liquid inlet/outlet 111, the third liquid inlet/outlet 121 and the fifth liquid inlet/outlet 131 may be connected to the liquid inlet end of the external cold source, and the second liquid inlet/outlet 112, the fourth liquid inlet/outlet 122 and the sixth liquid inlet/outlet 132 may be connected to the liquid outlet end of the external cold source.

The flow direction of the cooling liquid in the first liquid-cooling plate 110 is different from those in the second liquid-cooling plate 120 and the third liquid-cooling plate 130. That is, the cooling liquid in the first liquid-cooling plate 110 flows in a direction, and the cooling liquid in the second liquid-cooling plate 120 and in the third liquid-cooling plate 130 flows in another direction. Exemplarily, the first liquid inlet/outlet 111, the fourth liquid inlet/outlet 122 and the sixth liquid inlet/outlet 132 are connected to the liquid outlet end of the external cold source, and the second liquid inlet/outlet 112, the third liquid inlet/outlet 121 and the fifth liquid inlet/outlet 131 are connected to the liquid inlet end of the external cold source. Certainly, the first liquid inlet/outlet 111, the fourth liquid inlet/outlet 122 and the sixth liquid inlet/outlet 132 may be connected to the liquid inlet end of the external cold source, and the second liquid inlet/outlet 112, the third liquid inlet/outlet 121 and the fifth liquid inlet/outlet 131 may be connected to the liquid outlet end of the external cold source.

When the flow direction of the cooling liquid in the first liquid-cooling plate 110 is different from those in the second liquid-cooling plate 120 and the third liquid-cooling plate 130, the temperature equalization effect of the first electronic unit 210 and the second electronic unit 220 may be better improved. Taking the first electronic unit 210 as the example for description, the flow direction of the cooling liquid in the first liquid-cooling plate 110 at one surface of the first electronic unit 210 is opposite that in the second liquid-cooling plate 120 at the other surface. For the first electronic unit 210, the substrate of the first electronic unit 210 does not contact with the water inlet ends (the low-temperature ends) or the water outlet ends (the high-temperature ends) of the first liquid-cooling plate 110 and the second liquid-cooling plate 120 simultaneously, such that equalization of the temperature of the chips in different areas on the first electronic unit 210 is facilitated. Because the temperature of the cooling liquid is increased along the flow direction, the reduction magnitude of the temperature of the substrate contacting with the first electronic unit 210 is large at one side of the first electronic unit 210 close to the first liquid inlet/outlet 111 of the first liquid-cooling plate 110, and the reduction magnitude of the temperature of the chip side of the first electronic unit 210 is correspondingly small; and the temperature of the substrate contacting with the first electronic unit 210 is reduced at a small magnitude at one side of the first electronic unit 210 close to the second liquid inlet/outlet 112 of the first liquid-cooling plate 110, and the temperature of the chip side of the first electronic unit 210 is correspondingly greatly reduced, such that the temperature average values of the first electronic unit 210 near the first liquid inlet/outlet 111 and the second liquid inlet/outlet 112 are close. The cooling effect of the second electronic unit 220 is similar, which is not repeated herein.

The flow direction of the cooling liquid in the first liquid-cooling plate 110 is the same as that in one of the second liquid-cooling plate 120 and the third liquid-cooling plate 130, and is different from that in the other one of the second liquid-cooling plate 120 and the third liquid-cooling plate 130. That is, the cooling liquid in the first liquid-cooling plate 110 flows in one direction, the cooling liquid in one of the second liquid-cooling plate 120 and the third liquid-cooling plate 130 flows in the one direction, and the cooling liquid in the other one of the second liquid-cooling plate and the third liquid-cooling plate flows in the other direction. Exemplarily, the flow direction of the cooling liquid in the first liquid-cooling plate 110 is the same as that in the second liquid-cooling plate 120, but is opposite that in the third liquid-cooling plate 130. Certainly, the flow direction of the cooling liquid in the first liquid-cooling plate 110 may be opposite that in the second liquid-cooling plate 120, but is the same as that in the third liquid-cooling plate 130. In this case, the principle of the connection manner of the liquid inlet/outlets of each of the liquid-cooling plates is substantially the same as that of the connection manner of the liquid inlet/outlets in each of the embodiments, which is not repeated herein.

It is worth mentioning that the controller of the liquid-cooling heat dissipation apparatus 100 may control the flow directions of the cooling liquid in the first liquid-cooling plate 110, the second liquid-cooling plate 120 and the third liquid-cooling plate 130 according to the temperature equalization effect of the first electronic unit 210 and the second electronic unit 220. For example, the flow directions of the cooling liquid in the first liquid-cooling plate 110, the second liquid-cooling plate 120 and the third liquid-cooling plate 130 may be controlled to be the same. Alternatively, the cooling liquid in the first liquid-cooling plate 110 may be controlled to flow in one direction, and the cooling liquid in the second liquid-cooling plate 120 and the third liquid-cooling plate 130 may be controlled to flow in the other direction. Alternatively, the flow direction of the cooling liquid in the first liquid-cooling plate 110 may be controlled to be the same as that in the second liquid-cooling plate 120 and opposite that in the third liquid-cooling plate 130. Alternatively, the flow direction of the cooling liquid in the first liquid-cooling plate 110 may be controlled to be the same as that in the third liquid-cooling plate 130 and opposite that in the second liquid-cooling plate 120, etc.

The present application further provides the liquid-cooling data processing device, such as the virtual currency mining machine. The liquid-cooling data processing device includes the electronic device 200 and the liquid-cooling heat dissipation apparatus 100 stated in the above embodiments. The electronic device 200 includes the first electronic unit 210 and the second electronic unit 220, wherein the first electronic unit 210 and the second electronic unit 220 are hashboards. The liquid-cooling heat dissipation apparatus 100 bears the hashboard, so as to cool the hashboard. Once the liquid-cooling heat dissipation apparatus 100 of the above embodiments is used by the liquid-cooling virtual currency mining machine, the heat dissipation effect may be improved, and the working reliability of the liquid-cooling virtual currency mining machine is further improved. Certainly, the liquid-cooling virtual currency mining machine may also be other type of processing device.

In an embodiment, there are a plurality of the liquid-cooling virtual currency mining machines. The plurality of liquid-cooling virtual currency mining machines are arranged in a stacked manner. Alternatively, the plurality of liquid-cooling virtual currency mining machines are arranged side by side. When the operation capacity of the liquid-cooling virtual currency mining machine needs to be increased, the number of the electronic devices 200 may be increased to form the liquid-cooling cabinet machine. In this case, the first electronic unit 210 and the second electronic unit 220 of the electronic device 200 in each of the liquid-cooling virtual currency mining machines are arranged according to the above liquid-cooling heat dissipation apparatus 100. After each liquid-cooling heat dissipation apparatus 100 clamps the electronic device 200 to form the liquid-cooling virtual currency mining machine, the plurality of liquid-cooling virtual currency mining machines may be stacked in a thickness direction, or may be unfolded along the same plane, to form the liquid-cooling cabinet machine. In this case, the heat dissipation performance of the electronic device 200 is improved by the liquid-cooling heat dissipation apparatus 100, and the use performance of each liquid-cooling virtual currency mining machine is further improved.

The embodiments of the present application provide the liquid-cooling virtual currency mining machine, the liquid-cooling heat dissipation apparatus and the temperature equalization method. The first electronic unit and the second electronic unit are symmetrically arranged on the two sides of the first liquid-cooling plate, and the second liquid-cooling plate and the third liquid-cooling plate are further arranged on the other side surfaces of the first electronic unit and the second electronic unit. The two surfaces of the first electronic unit are cooled by the first liquid-cooling plate and the second liquid-cooling plate, and the two surfaces of the second electronic unit are cooled by the first liquid-cooling plate and the third liquid-cooling plate. The problem of non-uniform heat dissipation in the hashboard caused by the existing water-cooling radiator group is effectively solved, and heat dissipation is carried out on the two sides of the first electronic unit and the second electronic unit by the first liquid-cooling plate, the second liquid-cooling plate and the third liquid-cooling plate respectively, such that the heat dissipation effect of the first electronic unit and the second electronic unit may be effectively improved, the temperature between the first electronic unit and the second electronic unit is more equilibrated, the temperature difference is reduced, and the use performance of the liquid-cooling virtual currency mining machine is improved.

With reference to FIGS. 12-16, an embodiment of the present application further provides the liquid-cooling heat dissipation apparatus 100. The liquid-cooling heat dissipation apparatus 100 is applied to the liquid-cooling data processing apparatus, such as the liquid-cooling virtual currency mining machine 1000, and is used for cooling the electronic device 200 of the liquid-cooling virtual currency mining machine 1000, so as to ensure the use performance of the liquid-cooling virtual currency mining machine 1000.

With reference to FIGS. 12-16, in an embodiment, the liquid-cooling heat dissipation apparatus 100 includes the liquid-cooling structure 1210 and the pipeline structure 1220. The liquid-cooling structure 1210 includes the first liquid-cooling plate 110, the second liquid-cooling plate 120 and the third liquid-cooling plate 130. The second liquid-cooling plate 120 and the third liquid-cooling plate 130 are symmetrically arranged on the two sides of the first liquid-cooling plate 110. The first electronic unit 210 is arranged between the first liquid-cooling plate 110 and the second liquid-cooling plate 120, and the second electronic unit 220 is arranged between the first liquid-cooling plate 110 and the third liquid-cooling plate 130. The pipeline structure 1220 connects the first liquid-cooling plate 110, the second liquid-cooling plate 120, the third liquid-cooling plate 130 and the external cold source for inputting and outputting the cooling liquid.

The first liquid-cooling plate 110 is the main cooling structure of the liquid-cooling heat dissipation apparatus 100. The first liquid-cooling plate 110 has the first accommodation cavity for accommodating the cooling liquid. In an embodiment, the first accommodation cavity of the first liquid-cooling plate 110 may be multi channels in series-parallel such as being S-shaped. Alternatively, the first accommodation cavity of the first liquid-cooling plate 110 may be the integral cavity. Alternatively, the first accommodation cavity of the first liquid-cooling plate 110 may also be other structure for the cooling liquid to flow.

The second liquid-cooling plate 120 has the second accommodation cavity in which the cooling liquid flows. In an embodiment, the second accommodation cavity of the second liquid-cooling plate 120 may be multi channels in series-parallel such as being S-shaped. Alternatively, the second accommodation cavity of the second liquid-cooling plate 120 may be the integral cavity. Alternatively, the second accommodation cavity of the second liquid-cooling plate 120 may also be other structure for the cooling liquid to flow. After the cooling liquid enters the second accommodation cavity of the second liquid-cooling plate 120, the cooling liquid exchanges heat with the electronic device 200 by the second liquid-cooling plate 120, so as to cool the first electronic unit 210 of the electronic device 200.

The third liquid-cooling plate 130 has the third accommodation cavity in which the cooling liquid flows. In an embodiment, the third accommodation cavity of the third liquid-cooling plate 130 may be multi channels in series-parallel such as being S-shaped. Alternatively, the third accommodation cavity of the third liquid-cooling plate 130 may be the integral cavity. Alternatively, the third accommodation cavity of the third liquid-cooling plate 130 may also be other structure for the cooling liquid to flow. After the cooling liquid enters the third accommodation cavity of the third liquid-cooling plate 130, the cooling liquid exchanges heat with the electronic device 200 by the third liquid-cooling plate 130, so as to cool the second electronic unit 220 of the electronic device 200.

In an embodiment, when the liquid-cooling heat dissipation apparatus 100 of the present application is assembled, the aluminum substrates of the first electronic unit 210 and the second electronic unit 220 are attached to the two surfaces of the first liquid-cooling plate 110. The heat generated when the heating element works may be transferred to the first liquid-cooling plate 110 by the aluminum substrates to achieve liquid-cooling heat dissipation. Moreover, the second liquid-cooling plate 120 may abut against the heating element of the first electronic unit 210, and heat on the heating element side of the first electronic unit may be transferred to the second liquid-cooling plate 120, so as to ensure the liquid-cooling effect of the first electronic unit 210 and achieve liquid-cooling heat dissipation. The third liquid-cooling plate 130 may abut against the heating element of the second electronic unit 220, and heat on the heating element side of the second electronic unit may be transferred to the third liquid-cooling plate 130, so as to ensure the liquid-cooling heat dissipation effect of the second electronic unit 220 and achieve liquid-cooling heat dissipation.

The pipeline structure 1220 connects the first liquid-cooling plate 110, the second liquid-cooling plate 120 and the third liquid-cooling plate 130 and the external cold source. The external cold source has the liquid inlet end and the liquid outlet end, and the pipeline structure 1220 is connected to the liquid inlet end and the liquid outlet end. The cooling liquid in the external cold source is conveyed to the pipeline structure 1220 through the liquid outlet end, and is conveyed to the first liquid-cooling plate 110, the second liquid-cooling plate 120 and the third liquid-cooling plate 130 respectively by the pipeline structure 1220. The cooling liquid after the first liquid-cooling plate 110, the second liquid-cooling plate 120 and the third liquid-cooling plate 130 cools the first electronic unit 210 and the second electronic unit 220 flows back to the pipeline structure 1220 and returns to the external cold source through the liquid inlet end. The external cold source may cool the recycled cooling liquid, and then conveys the cooling liquid to the pipeline structure 1220. The cycle continues to achieve the recycle of the cooling liquid and to reduce the cooling cost. In an embodiment, the cooling liquid in the external cold source may be cooling water, may also be cooling oil or liquid helium, etc.

In the liquid-cooling heat dissipation apparatus 100 of the above embodiments, the pipeline assembly conveys the cooling liquid of the external cold source to the first liquid-cooling plate 110, the second liquid-cooling plate 120 and the third liquid-cooling plate 130. The first electronic unit 210 and the second electronic unit 220 are cooled by the first liquid-cooling plate 110, the second liquid-cooling plate 120 and the third liquid-cooling plate 130. The pipeline assembly conveys the cooling liquid after cooling to the external cold source. As such, the problem that at present, heat dissipation efficiency of chips is low, and there is a temperature difference between the chips, thereby affecting the use performance of the hashboard may be effectively solved, cooling efficiency of the first electronic unit 210 and the second electronic unit 220 is improved, and the heat dissipation effect is ensured, such that the temperature between the first electronic unit 210 and the second electronic unit 220 is equilibrated, the temperature difference is avoided, and the use performance of the liquid-cooling virtual currency mining machine 1000 is ensured.

In an embodiment, the cooling capacity of the first liquid-cooling plate 110 is greater than that of the second liquid-cooling plate 120 and the third liquid-cooling plate 130. Due to the structural limitation of the first electronic unit 210 and the second electronic unit 220, the amount of heat of the aluminum substrate dissipated towards the first liquid-cooling plate 110 is relatively large, and the amount of heat of the heating element dissipated towards the second liquid-cooling plate 120 and the third liquid-cooling plate 130 is relatively small. In order to ensure the heat dissipation effect, the cooling capacity of the first liquid-cooling plate 110 is improved, so as to improve the heat dissipation capacity of the first liquid-cooling plate 110 to the aluminum substrate. Correspondingly, the cooling capacity of the second liquid-cooling plate 120 and the third liquid-cooling plate 130 may be suitably reduced, for example, as long as it is ensured that the heat of the heating element may be dissipated. In this way, the complexity of the structure and the cost may be also reduced, while the heat dissipation effect of the first electronic unit 210 and the second electronic unit 220 may be ensured.

In an embodiment, the first liquid-cooling plate 110 has the first accommodation cavity, the second liquid-cooling plate 120 has the second accommodation cavity, and the third liquid-cooling plate 130 has the third accommodation cavity. The heat dissipation area of the first accommodation cavity is greater than that of the second accommodation cavity, and the heat dissipation area of the first accommodation cavity is greater than that of the third accommodation cavity. It may be understood that the heat dissipation area herein refers to the area that may perform the effective cooling. For example, the flow channel area inside the first liquid-cooling plate 110 is greater than that inside the second liquid-cooling plate 120 and that inside the third liquid-cooling plate 130. The flow channel area inside the first liquid-cooling plate 110 may be a bit larger, and the flow channel area inside the second liquid-cooling plate 120 and the third liquid-cooling plate 130 may be a bit smaller. In this way, manufacturing cost may be reduced while the heat dissipation effect is ensured.

Further, the heat dissipation protrusion or the heat dissipation fin may be arranged in the first accommodation cavity, and the heat dissipation capacity of the first liquid-cooling plate 110 is improved by the heat dissipation protrusion or the heat dissipation fin, thereby the cooling effect of the first liquid-cooling plate 110 is further improved.

In an embodiment, the electronic device 200 further includes the power supply 230, and the liquid-cooling structure 1210 further includes the fourth liquid-cooling plate 140 connected to the pipeline structure 1220. The fourth liquid-cooling plate 140 has the fifth cooling surface, and the fifth cooling surface is attached to the power supply 230 for cooling the power supply 230. The power supply 230 supplies power to the first electronic unit 210 and the second electronic unit 220, so as to ensure that the first electronic unit 210 and the second electronic unit 220 may work normally, and meanwhile, the power supply 230 has the input terminal 231 for connecting to the external power supply.

The fourth liquid-cooling plate 140 has the fourth accommodation cavity, and the cooling liquid flows in the fourth accommodation cavity. In an embodiment, the fourth accommodation cavity of the fourth liquid-cooling plate 140 may be the multi-channel series-parallel channel such as in S-shaped. Alternatively, the fourth accommodation cavity of the fourth liquid-cooling plate 140 may be the integral cavity. Alternatively, the fourth accommodation cavity of the fourth liquid-cooling plate 140 may be other structure for the cooling liquid to flow. After the cooling liquid enters the fourth accommodation cavity of the fourth liquid-cooling plate 140, the cooling liquid exchanges heat with the electronic device 200 by the fourth liquid-cooling plate 140, so as to cool the power supply 230 of the electronic device 200. The fourth liquid-cooling plate 140 has the cooling surface, i.e., the fifth cooling surface. The fifth cooling surface is arranged towards the power supply 230. That is, the fifth cooling surface abuts against the surface of the power supply 230. The cooling liquid in the fourth accommodation cavity exchanges heat with the power supply 230 by the fifth cooling surface to reduce the temperature of the power supply 230.

In an embodiment, the first liquid-cooling plate 110 has the first liquid inlet/outlet 111 and the second liquid inlet/outlet 112, the second liquid-cooling plate 120 has the third liquid inlet/outlet 121 and the fourth liquid inlet/outlet 122, the third liquid-cooling plate 130 has the fifth liquid inlet/outlet 131 and the sixth liquid inlet/outlet 132, and the fourth liquid-cooling plate 140 has the seventh liquid inlet/outlet A7 and the eighth liquid inlet/outlet A8. The pipeline structure 1220 is connected to each of the liquid inlet/outlets in series and/or in parallel.

The first liquid-cooling plate 110 has the first liquid inlet/outlet 111 and the second liquid inlet/outlet 112 in communication with the first accommodation cavity. The second liquid-cooling plate 120 has the third liquid inlet/outlet 121 and the fourth liquid inlet/outlet 122 in communication with the second accommodation cavity. The third liquid-cooling plate 130 has the fifth liquid inlet/outlet 131 and the sixth liquid inlet/outlet 132 in communication with the third accommodation cavity. The fourth liquid-cooling plate 140 has the seventh liquid inlet/outlet A7 and the eighth liquid inlet/outlet A8 in communication with the fourth accommodation cavity. The seventh liquid inlet/outlet A7 and the eighth liquid inlet/outlet A8 are, for example, the liquid inlet and the liquid outlet of the fourth liquid-cooling plate 140. When the seventh liquid inlet/outlet A7 is the liquid inlet, the eighth liquid inlet/outlet A8 is the liquid outlet. When the seventh liquid inlet/outlet A7 is the liquid outlet, the eighth liquid inlet/outlet A8 is the liquid inlet.

The liquid inlet/outlets of each of the liquid-cooling plates are connected by the pipeline structure 1220 to input and output the cooling liquid. In principle, the connection manner among each of the liquid-cooling plates is not limited in principle as long as cooling of the electronic device 200 may be implemented. In an embodiment, two liquid inlet/outlets of each of the liquid-cooling plates may be independently connected to the external cold source, and in this case, the first liquid-cooling plate 110, the second liquid-cooling plate 120, the third liquid-cooling plate 130 and the fourth liquid-cooling plate 140 are connected in parallel. In this case, the external cold source conveys the cooling liquid to each of the liquid-cooling plates respectively. Certainly, the first liquid-cooling plate 110, the second liquid-cooling plate 120, the third liquid-cooling plate 130 and the fourth liquid-cooling plate 140 may be connected in series by the pipeline structure 1220, and the cooling liquid conveyed by the external cold source sequentially flows into each of the liquid-cooling plates. In other implementation of the present application, it is possible that one or several of the liquid-cooling plates are connected in series, which is connected to the remaining liquid-cooling plate in parallel.

In an embodiment, the first liquid inlet/outlet 111 and the second liquid inlet/outlet 112 may be provided on the same side or on different sides. The third liquid inlet/outlet 121 and the fourth liquid inlet/outlet 122 may be provided on the same side or on different sides. The fifth liquid inlet/outlet 131 and the sixth liquid inlet/outlet 132 may be provided on the same side or on different sides. The seventh liquid inlet/outlet A7 and the eighth liquid inlet/outlet A8 may be provided on the same side or on different sides.

Figure 15:
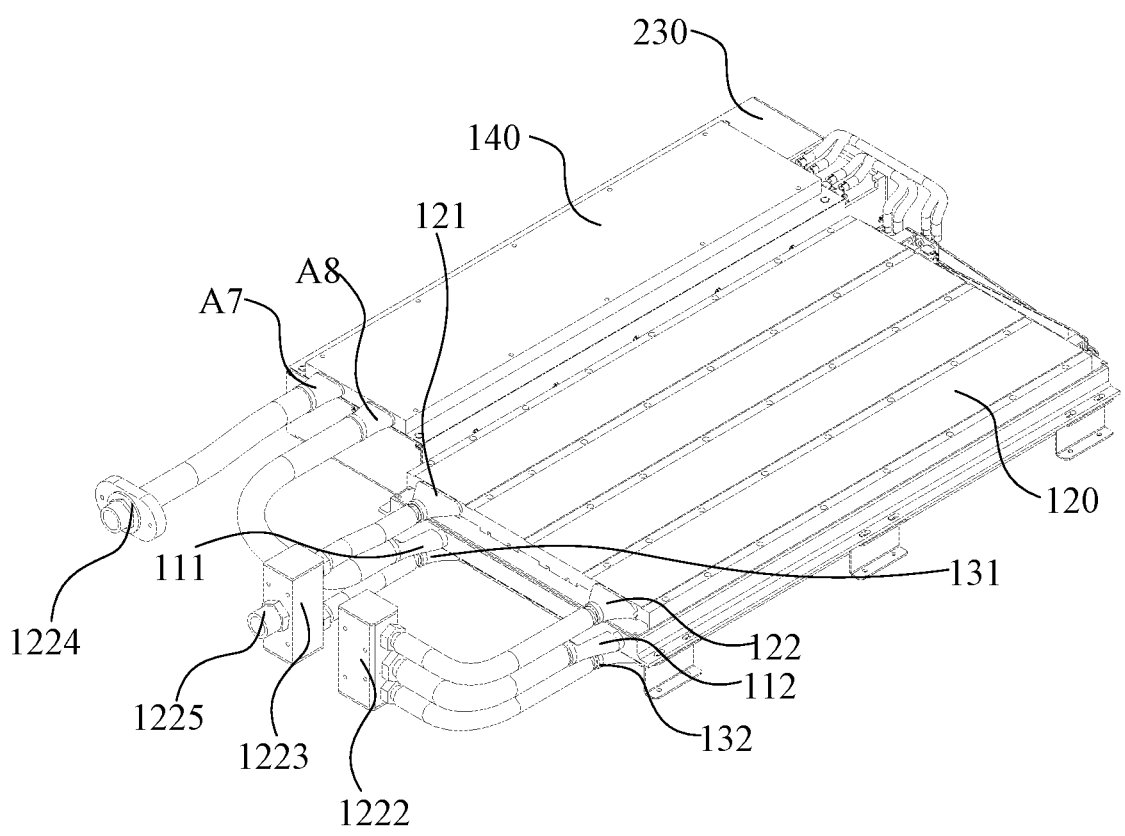
FIG. 15 is a perspective diagram of an implementation of the liquid-cooling heat dissipation apparatus shown in FIG. 12 with the case housing detached.

Position arrangements of the seventh liquid inlet/outlet A7 and the eighth liquid inlet/outlet A8 are not limited in principle, and the seventh liquid inlet/outlet and the eighth liquid inlet/outlet may be provided on the same side or on different sides. Exemplarily, the seventh liquid inlet/outlet A7 and the eighth liquid inlet/outlet A8 may be provided on the two sides of the fourth liquid-cooling plate 140 respectively. Certainly, the seventh liquid inlet/outlet A7 and the eighth liquid inlet/outlet A8 may be provided on the same side of the fourth liquid-cooling plate 140, as shown in FIG. 15.

With reference to FIGS. 12-16, in an embodiment, the fourth liquid-cooling plate 140 is connected to the first liquid-cooling plate 110, the second liquid-cooling plate 120 and the third liquid-cooling plate 130 in series or in parallel. That is, the first liquid-cooling plate 110, the second liquid-cooling plate 120 and the third liquid-cooling plate 130 as a whole may be connected to the fourth liquid-cooling plate 140 in parallel or in series.

In an embodiment, the pipeline structure 1220 connects the fourth liquid-cooling plate 140 to the first liquid-cooling plate 110, the second liquid-cooling plate 120 and the third liquid-cooling plate 130 in series. The cooling liquid may enter the fourth liquid-cooling plate 140, and then enters the first liquid-cooling plate 110, the second liquid-cooling plate 120 and the third liquid-cooling plate 130. Since the power supply 230 has a small heating amount and a poor heat resistance, the fourth liquid-cooling plate 140 for cooling the power supply 230 may be used as the inlet of the cooling liquid to participate in heat exchange first, and then to be connected to the first liquid-cooling plate 110, the second liquid-cooling plate 120 and the third liquid-cooling plate 130 in series to convey the cooling liquid. In this way, the temperature rise of the cooling liquid after cooling the power supply 230 will not be too high, and the heat dissipation requirement of the first electronic unit 210 and the second electronic unit 220 may still be ensured. In other embodiment, the cooling liquid may enter the fourth liquid-cooling plate 140 at last.

Certainly, in other implementation of the present application, the pipeline structure 1220 connects the fourth liquid-cooling plate 140 to the first liquid-cooling plate 110, the second liquid-cooling plate 120 and the third liquid-cooling plate 130 in parallel. That is, the cooling liquid flows into the whole formed by the first liquid-cooling plate 110, the second liquid-cooling plate 120 and the third liquid-cooling plate 130, and into the fourth liquid-cooling plate 140 respectively via the pipeline structure 1220.

In an embodiment, the first liquid-cooling plate 110, the second liquid-cooling plate 120 and the third liquid-cooling plate 130 are connected in series or in parallel. Alternatively, the first liquid-cooling plate 110 is connected to the second liquid-cooling plate 120 and the third liquid-cooling plate 130 in series respectively, and the second liquid-cooling plate 120 is connected to the third liquid-cooling plate 130 in parallel. In an embodiment of the present application, taking the fourth liquid-cooling plate 140 be connected in series to a whole which is formed by the first liquid-cooling plate 110, the second liquid-cooling plate 120 and the third liquid-cooling plate 130 as an example for description.

In an embodiment, the first liquid-cooling plate 110, the second liquid-cooling plate 120 and the third liquid-cooling plate 130 are connected in parallel. In this case, the cooling liquid output by the fourth liquid-cooling plate 140 is conveyed to the first liquid-cooling plate 110, the second liquid-cooling plate 120 and the third liquid-cooling plate 130 respectively, so as to cool the first electronic unit 210 and the second electronic unit 220.

The first electronic unit 210 and the second electronic unit 220 are combined by the connection of the first liquid-cooling plate 110, the second liquid-cooling plate 120 and the third liquid-cooling plate 130 in series and in parallel, such that the cooling liquid flows between the first electronic unit 210 and the second electronic unit 220 in a reciprocating manner to improve the heat dissipation efficiency of the first electronic unit 210 and the second electronic unit 220 and to reduce the temperature difference between the cooling liquid and the highest temperature of the first electronic unit 210 or the second electronic unit 220, thereby enhancing the temperature of the cooling liquid, and satisfying the requirement of waste heat recovery.

With reference to FIGS. 12-16, in an embodiment, the pipeline structure 1220 includes the inlet connector 1224, the outlet connector 1225, the liquid-cooling pipeline group 1221, the first liquid dispenser/collector 1222 and the second liquid dispenser/collector 1223. The liquid-cooling pipeline group 1221 may connect the first liquid-cooling plate 110, the second liquid-cooling plate 120, the third liquid-cooling plate 130 and the fourth liquid-cooling plate 140 via the first liquid dispenser/collector 1222 and the second liquid dispenser/collector 1223. The liquid-cooling pipeline group 1221 is further connected to the external cold source via the inlet connector 1224 and the outlet connector 1225.

The inlet connector 1224 and the outlet connector 1225 are used for connecting the liquid-cooling pipeline group 1221 to the external cold source. The inlet connector 1224 is connected to the liquid outlet end of the external cold source, and the outlet connector 1225 is connected to the liquid inlet end of the external cold source. The cooling liquid in the external cold source enters the liquid-cooling pipeline group 1221 through the liquid outlet end and the inlet connector 1224, and the cooling liquid in the liquid-cooling pipeline group 1221 flows back to the external cold source through the outlet connector 1225 and the liquid inlet end.

The liquid-cooling pipeline group 1221 includes a plurality of cooling pipelines. The cooling pipelines are connected to each of the liquid inlet/outlets of the first liquid-cooling plate 110, the second liquid-cooling plate 120, the third liquid-cooling plate 130 and the fourth liquid-cooling plate 140 respectively. The liquid-cooling plates are connected in series and in parallel by the first liquid dispenser/collector 1222 and the second liquid dispenser/collector 1223, so as to satisfy different cooling requirements. In an embodiment, each of the cooling pipelines is the hard pipe, or the customized special-shaped pipe, etc.

A first liquid dispenser/collector 1222 has the first connector, the second connector and the third connector. The first liquid dispenser/collector 1222 connects the first liquid-cooling plate 110, the second liquid-cooling plate 120 and the third liquid-cooling plate 130 in series and in parallel by the first connector, the second connector and the third connector. Exemplarily, the first connector is connected to the second liquid inlet/outlet 112 of the first liquid-cooling plate 110, the second connector is connected to the fourth liquid inlet/outlet 122 of the second liquid-cooling plate 120, and the third connector is connected to the sixth liquid inlet/outlet 132 of the third liquid-cooling plate 130. Each of the liquid inlet/outlets is connected to the connector by the cooling pipeline. In an embodiment, the first connector, the second connector and the third connector may be provided on the same side or on different sides.

The second liquid dispenser/collector 1223 has the fourth connector, the fifth connector and the sixth connector. The second liquid dispenser/collector 1223 connects the first liquid-cooling plate 110, the second liquid-cooling plate 120 and the third liquid-cooling plate 130 in series and in parallel by the fourth connector, the fifth connector and the sixth connector and then outputs the cooling liquid. Exemplarily, the fourth connector is connected to the third liquid inlet/outlet 121 of the second liquid-cooling plate 120, the fifth connector is connected to the fifth liquid inlet/outlet 131 of the third liquid-cooling plate 130, and the sixth connector is connected to the outlet connector 1225. Each of the liquid inlet/outlets is connected to the connector by the cooling pipeline. In an embodiment, the fourth connector, the fifth connector and the sixth connector may be provided on the same side or on different sides.

Figure 12:
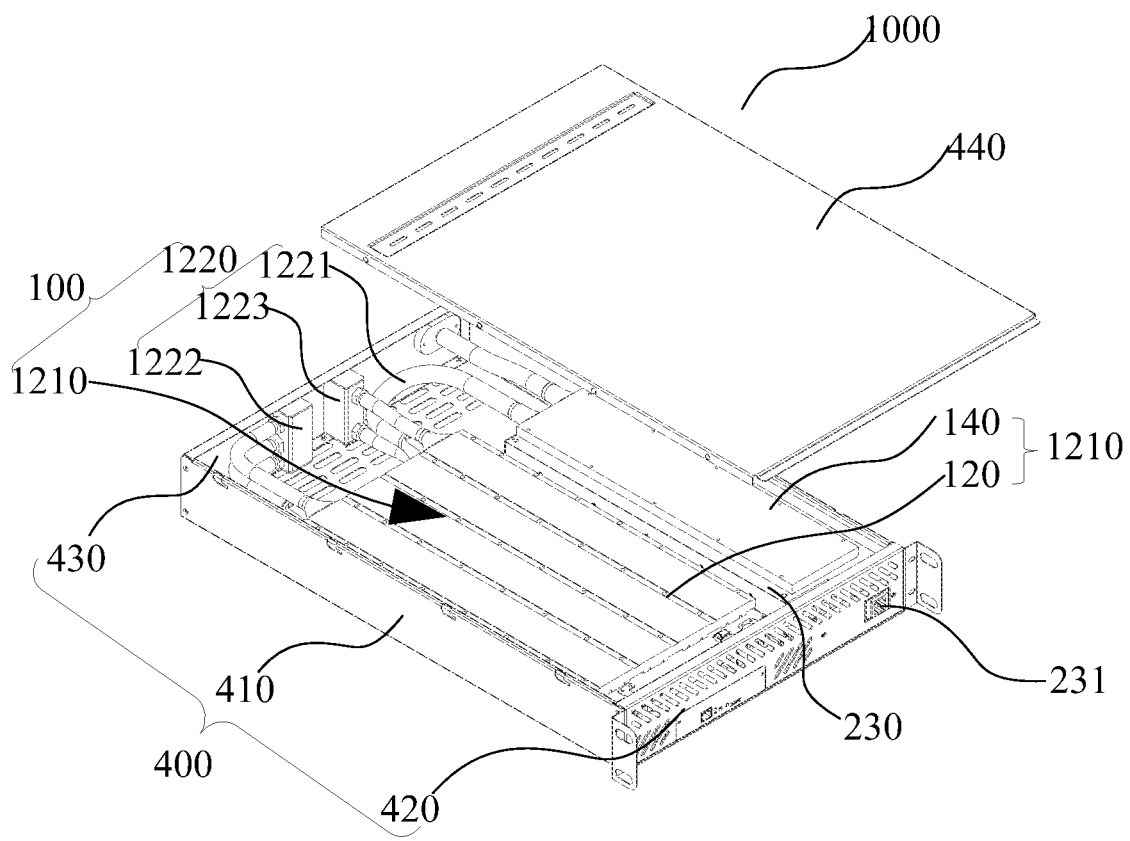
FIG. 12 is a perspective diagram of the liquid-cooling heat dissipation apparatus with the case cover plate being detached in an embodiment of the present application.
Figure 13:
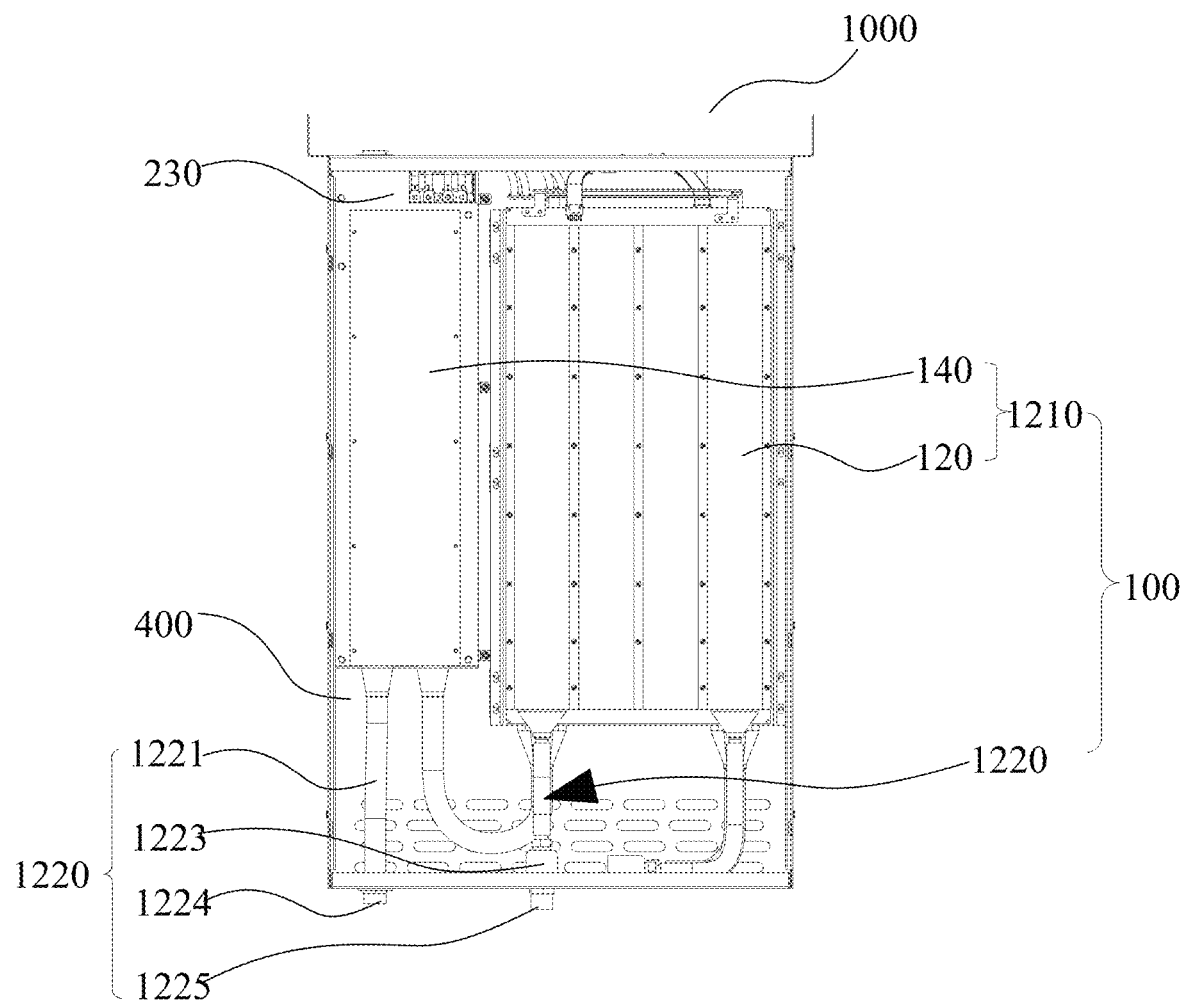
FIG. 13 is a top view of the liquid-cooling heat dissipation apparatus with the case cover plate detached shown in FIG. 12.
Figure 16:
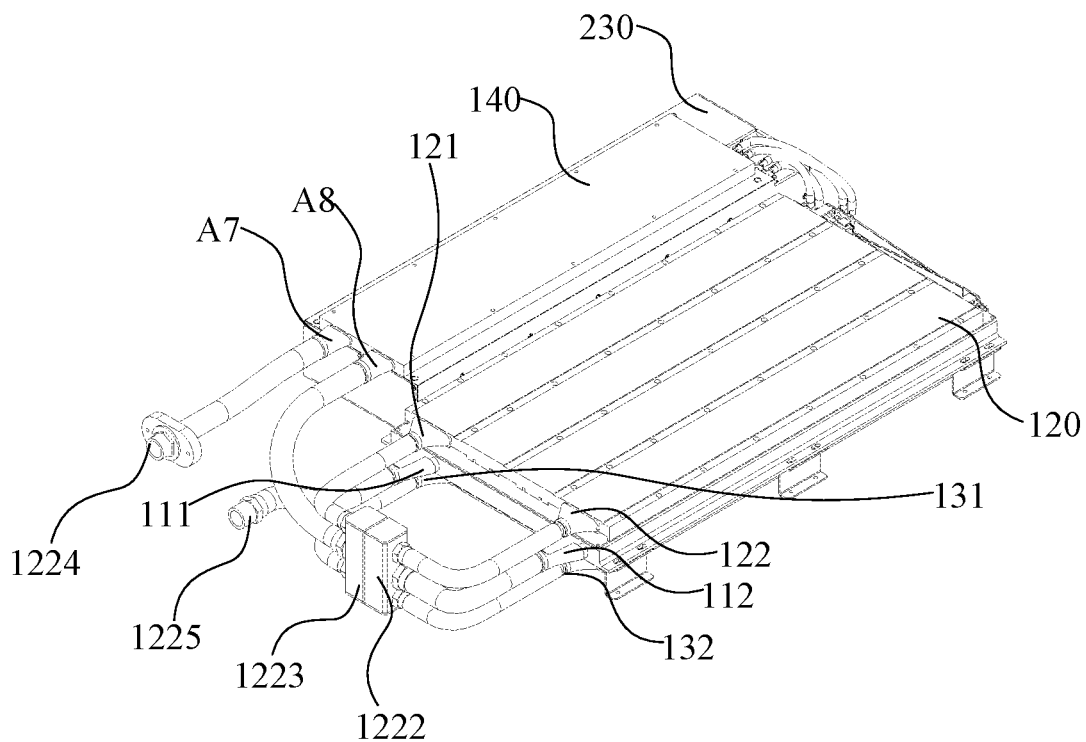
FIG. 16 is a perspective diagram of another implementation of the liquid-cooling heat dissipation apparatus shown in FIG. 15 with the case housing detached.

It is worth mentioning that the connectors of the first liquid dispenser/collector 1222 and the second liquid dispenser/collector 1223 may have different functions due to different cooling pipelines connected thereto. For example, in the above embodiment, the first liquid dispenser/collector 1222 is the liquid dispenser, and the second liquid dispenser/collector 1223 is the liquid collector. Certainly, in other implementation of the present application, the functions of the first liquid dispenser/collector 1222 and the second liquid dispenser/collector 1223 may be changed by exchanging the connection manner of the cooling pipelines. As shown in FIG. 12, when the cooling liquid enters the second liquid-cooling plate 120 and the third liquid-cooling plate 130 from the third liquid inlet/outlet 121 and the fifth liquid inlet/outlet 131, the first liquid dispenser/collector 1222 is the liquid collector, and the second liquid dispenser/collector 1223 is the liquid dispenser. In an embodiment of the present application, the second liquid dispenser/collector 1223 is arranged separately from the first liquid dispenser/collector 1222, as shown in FIG. 15. Certainly, the second liquid dispenser/collector 1223 and the first liquid dispenser/collector 1222 may be of the integral structure, as shown in FIG. 16. In other implementation of the present application, the first liquid dispenser/collector 1222 and the second liquid dispenser/collector 1223 may also be three-way valves (or three-way connectors), etc.

Figure 14:
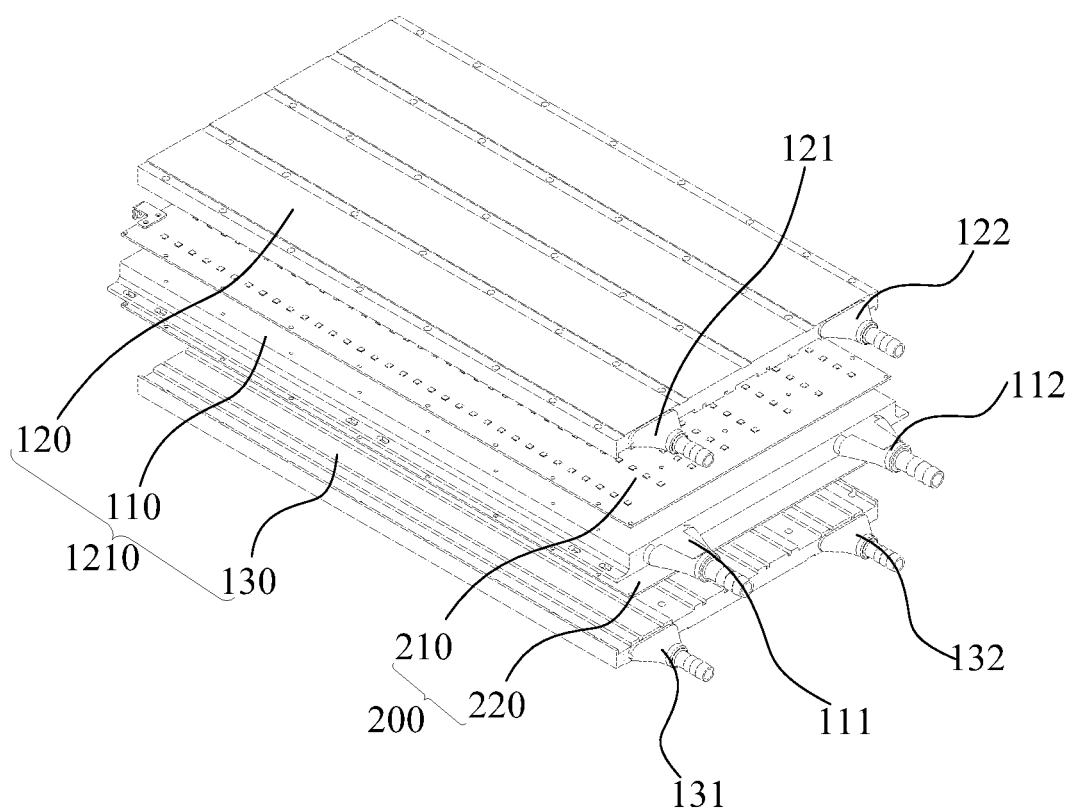
FIG. 14 is an exploded schematic diagram of the liquid-cooling structure in the liquid-cooling heat dissipation apparatus shown in FIG. 12 clamping the first electronic unit and the second electronic unit.

With reference to FIGS. 14-16, in an embodiment, the inlet connector 1224 is connected to the seventh liquid inlet/outlet A7 of the fourth liquid-cooling plate 140, the eighth liquid inlet/outlet A8 of the fourth liquid-cooling plate 140 is connected to the first liquid inlet/outlet 111 of the first liquid-cooling plate 110, the second liquid inlet/outlet 112 of the first liquid-cooling plate 110 is connected to the fourth liquid inlet/outlet 122 of the second liquid-cooling plate 120 and the sixth liquid inlet/outlet 132 of the third liquid-cooling plate 130 respectively by the first liquid dispenser/collector 1222, and the third liquid inlet/outlet 121 of the second liquid-cooling plate 120 and the fifth liquid inlet/outlet 131 of the third liquid-cooling plate 130 are connected to the outlet connector 1225 by the second liquid dispenser/collector 1223.

In the present application, taking the fourth liquid-cooling plate 140 be connected to the first liquid-cooling plate 110 in series, which is then connected to the second liquid-cooling plate 120 and the third liquid-cooling plate 130 in series respectively, and the second liquid-cooling plate 120 be connected to the third liquid-cooling plate 130 in parallel as the example, the connection of the liquid inlet/outlets and flowing of the cooling liquid are described.

The liquid outlet end of the external cold source is connected to the seventh liquid inlet/outlet A7 of the fourth liquid-cooling plate 140 by the inlet connector 1224, the eighth liquid inlet/outlet A8 of the fourth liquid-cooling plate 140 is connected to the first liquid inlet/outlet 111 of the first liquid-cooling plate 110, and the second liquid inlet/outlet 112 of the first liquid-cooling plate 110 is connected to the fourth liquid inlet/outlet 122 of the second liquid-cooling plate 120 and the sixth liquid inlet/outlet 132 of the third liquid-cooling plate 130 by the first liquid dispenser/collector 1222. The third liquid inlet/outlet 121 of the second liquid-cooling plate 120 and the fifth liquid inlet/outlet 131 of the third liquid-cooling plate 130 are connected to the liquid inlet end of the external cold source through the outlet connector 1225 by the second liquid dispenser/collector 1223.

The cooling liquid output by the external cold source enters the fourth liquid-cooling plate 140 via the inlet connector 1224 and the liquid-cooling pipeline group 1221, and then cools the power supply 230 by the fourth liquid-cooling plate 140. The cooling liquid exchanging heat with the power supply 230 flows into the first liquid-cooling plate 110 by the liquid-cooling pipeline group 1221, and cools one surface of the first electronic unit 210 and one surface of the second electronic unit 220 respectively by the first liquid-cooling plate 110. Then, the cooling liquid flows out from the first liquid-cooling plate 110, flows into the second liquid-cooling plate 120 and the third liquid-cooling plate 130 respectively by the shunting of the first liquid dispenser/collector 1222, and cools the other surface of the first electronic unit 210 and the other surface of the second electronic unit 220. The cooling liquid after cooling flows out from the second liquid-cooling plate 120 and the third liquid-cooling plate 130, is converged to the outlet connector 1225 by the second liquid dispenser/collector 1223, and then flows back to the external cold source.

Moreover, when the cooling liquid flows among the first liquid-cooling plate 110, the second liquid-cooling plate 120 and the third liquid-cooling plate 130, the flow direction of the cooling liquid in the first liquid-cooling plate 110 may be opposite that in the second liquid-cooling plate 120 and the third liquid-cooling plate 130. In this way, it may be ensured that the flow directions of the cooling liquid on the two sides of the first electronic unit 210 are different, and opposite flows are formed on the two sides of the first electronic unit 210, such that the temperature of the first electronic unit 210 is equilibrated, and the temperature difference between the cooling liquid and the first electronic unit 210 may be reduced. In an embodiment, the sum of the flow channel resistances of the second liquid-cooling plate 120 and the third liquid-cooling plate 130 is substantially consistent with the sum of the flow channel resistances of the first liquid-cooling plate 110, such that it is ensured that the flow velocity in the whole liquid-cooling structure 1210 is consistent.

Certainly, in other embodiment of the present application, the connection manner of the liquid inlet/outlets of each of the liquid-cooling plates and the flow direction of the cooling liquid may be appropriately adjusted, and the connection manner and the principle thereof are substantially the same, which is not repeated herein.

The present application further provides the liquid-cooling virtual currency mining machine 1000. The liquid-cooling virtual currency mining machine includes the electronic device 200 and the liquid-cooling heat dissipation apparatus 100 in the above embodiments. The electronic device 200 includes the first electronic unit 210, the second electronic unit 220 and the power supply 230, and the liquid-cooling heat dissipation apparatus cools the first electronic unit 210, the second electronic unit 220 and the power supply 230. After the liquid-cooling heat dissipation apparatus 100 in the above embodiments is used by the liquid-cooling virtual currency mining machine 1000 of the present application, the heat dissipation effect of the electronic device 200 may be ensured, and the working reliability of the liquid-cooling virtual currency mining machine 1000 is further ensured. Certainly, the liquid-cooling virtual currency mining machine 1000 may also be other type of data processing device.

In an embodiment, the liquid-cooling virtual currency mining machine 1000 further includes the case housing 400. The electronic device 200 and the liquid-cooling structure 1210 and the pipeline structure 1220 of the liquid-cooling heat dissipation apparatus 100 are all arranged in the case housing 400. The case housing 400 is the housing of the liquid-cooling heat dissipation apparatus 100. The case housing 400 has the mounting space, and the mounting space is used for mounting the electronic unit of the electronic device 200, the liquid-cooling structure 1210, and the pipeline structure 1220 of the virtual currency mining machine. The case housing 400 further has the protective effect, prevents external sundries from entering, and moreover, may avoid external objects from touching the electronic device 200, thereby ensuring that the electronic device 200 may work normally. In addition, all parts of the liquid-cooling heat dissipation apparatus 100 may form the whole by the case housing 400, such that use is facilitated.

In an embodiment, the case housing 400 includes the bearing housing 410 and the first side plate 420, the second side plate 430 and the case cover plate 440 arranged on the bearing housing 410. The first side plate 420 and the second side plate 430 are oppositely arranged, the case cover plate 440 covers the top of the bearing housing 410, the input terminal 231 of the electronic device 200 is arranged on the first side plate 420, the inlet connector 1224 and the outlet connector 1225 of the pipeline structure 1220 are arranged on the second side plate 430. The bearing housing 410 is arranged in the U shape. The first side plate 420 and the second side plate 430 are arranged on the two opposite side surfaces of the bearing bottom housing, and the case cover plate 440 covers the bearing housing 410, such that the first side plate 420, the second side plate 430, the bearing housing 410 and the case cover plate 440 may form the case body having the mounting space.

Moreover, the inlet connector 1224 and the outlet connector 1225 penetrate the second side plate 430 to extend for being connected to the external cold source. the input terminal of the power supply 230 penetrates the first side plate 420 to extend, so as to facilitate connection to the external power supply. Moreover, the fixer is arranged inside the first side plate 420, and fixes the first liquid dispenser/collector 1222 and the second liquid dispenser/collector 1223.

With reference to FIGS. 12-17, in an embodiment, the liquid-cooling virtual currency mining machine 1000 further includes the connection assembly 240. The connection assembly 240 connects the first electronic unit 210 and the second electronic unit 220 to the power supply 230 respectively. The connection assembly 240 electrically connects the first electronic unit 210 to the power supply 230, and electrically connects the second electronic unit 220 to the power supply 230. In this way, the power supply 230 supplies power to the first electronic unit 210 and the second electronic unit 220, such that the first electronic unit 210 and the second electronic unit 220 work normally.

In an embodiment, the connection assembly 240 includes the copper bar and the connection cable. The first electronic unit 210 is connected to the power supply 230 by the copper bar and the connection cable. Two ends of the copper bar are electrically connected to the first electronic unit 210 and the second electronic unit 220 respectively, and one end of the copper bar is electrically connected to the power supply 230 by the connection cable.

Figure 17:
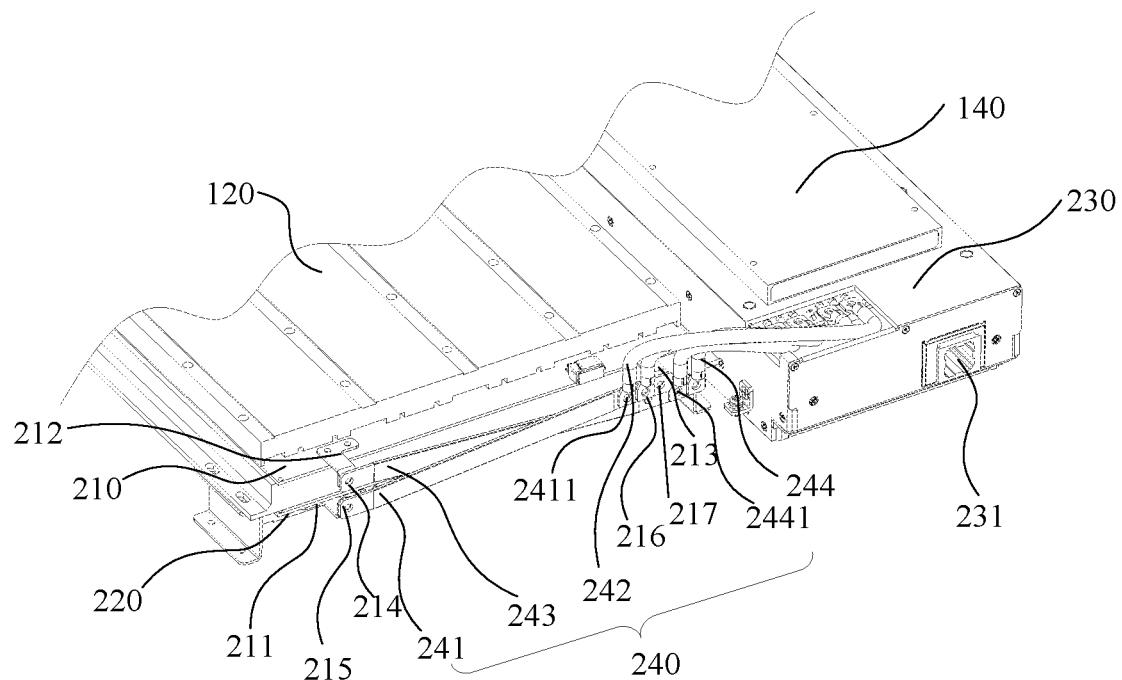
FIG. 17 is a perspective diagram of the liquid-cooling heat dissipation apparatus shown in FIG. 15 with the case housing detached from another point of view.

With reference to FIG. 17, in an embodiment, the connection assembly 240 includes the positive copper bar 241, the negative copper bar 243, the positive cable 242 and the negative cable 244. The positive copper bar 241 and the negative copper bar 243 are arranged in the crossed manner. The positive copper bar 241 is arranged at the anode 213 of the first electronic unit 210, and the negative copper bar 243 is arranged at the cathode 212 of the first electronic unit 210. The positive copper bar 241 is arranged at the anode 211 of the second electronic unit 220, and the negative copper bar 243 is arranged at the cathode (which is not shown in the figure) of the second electronic unit 220. The anode 213 of the first electronic unit 210 and the cathode of the second electronic unit 220 are arranged at the same ends of the positive copper bar 241 and the negative copper bar 243, and the cathode 212 of the first electronic unit 210 and the anode 211 of the second electronic unit 220 are arranged at the same ends of the negative copper bar 243 and the positive copper bar 241. The positive copper bar 241 has the positive fixing hole 2411 connected to the positive cable 242, the positive fixing hole 2411 is located at the inner position of the positive copper bar 241. The negative copper bar 243 has the negative fixing hole 2441 connected to the negative cable 244, and the negative fixing hole 2441 is located at outer position of the negative copper bar 243. It may be understood that the inner position herein means that the positive fixing hole 2411 is located between the joint 217 between the positive copper bar 241 and the anode 213 of the first electronic unit 210 and the joint 215 between the positive copper bar 241 and the anode 211 of the second electronic unit 220. The outer position herein means that the negative fixing hole 2441 is located at the position other than the joint 214 between the negative copper bar 243 and the cathode 212 of the first electronic unit 210 and the joint 216 between the negative copper bar 243 and the cathode of the second electronic unit 220.

In an embodiment, the length of the positive cable 242 is greater than that of the negative cable 244. In this way, reverse connection of the components of anode and cathode may be avoided, the first electronic unit 210 and the second electronic unit 220 are prevented from being burnt out, and use safety is ensured. Certainly, in other implementation of the present application, the connection structures of the anode and the cathode may be different, so as to achieve the purpose of preventing the anode and the cathode from being reversely connected.

In the liquid-cooling virtual currency mining machine and the liquid-cooling heat dissipation apparatus of the embodiments of the present application, the first liquid-cooling plate, the second liquid-cooling plate and the third liquid-cooling plate of the liquid-cooling structure are connected by the pipeline structure. Moreover, the first electronic unit and the second electronic unit are arranged on the two sides of the first liquid-cooling plate respectively, and the second liquid-cooling plate and the third liquid-cooling plate are further arranged on the outer sides of the first electronic unit and the second electronic unit. The pipeline assembly conveys the cooling liquid of the external cold source to the first liquid-cooling plate, the second liquid-cooling plate and the third liquid-cooling plate, the first electronic unit and the second electronic unit are cooled by the first liquid-cooling plate, the second liquid-cooling plate and the third liquid-cooling plate, and the pipeline assembly conveys the cooling liquid after cooling to the external cooling liquid. The problem that at present, the heat dissipation efficiency of the chip is low, and there is a temperature difference between the chips, thereby affecting the use performance of the hashboard may be effectively solved, the cooling efficiency of the first electronic unit and the second electronic unit is improved, and the heat dissipation effect is ensured, such that the temperature between the first electronic unit and the second electronic unit is equilibrated, the temperature difference is avoided, and use performance of the liquid-cooling virtual currency mining machine is ensured.

The basic principles of the present application are described above in connection with particular embodiments. However, it is to be noted that the advantages, strengths, effects, etc. mentioned in the present application are merely examples and not limitations, and these advantages, strengths, effects, etc. shall not be considered to be necessary for each of the embodiments of the present application. In addition, specific details disclosed above are only for examples and understanding rather than limitation, and the above details do not limit the present application to be implemented with the above specific details.

The block diagrams of components, apparatuses, devices, and systems involved in the present application are only illustrative examples, and are not intended to require or imply that connections, arrangements, and configurations must be made in the manner shown in the block diagrams. As will be recognized by those skilled in the art, these components, apparatuses, devices, and systems may be connected, arranged, and configured in any manner. Words such as "comprising", "including", "having", etc. are open-ended words, which refer to "including, but not limited to" and may be used interchangeably therewith. Words "or" and "and" used herein refer to words "and/or", and may be used interchangeably therewith, unless the context clearly dictates otherwise. Words "such as" used herein refer to "such as but not limited to", and may be used interchangeably therewith.

It should be further noted that in the apparatuses, devices, and methods of the present application, components or steps may be decomposed and/or recombined. Such decomposition and/or recombination should be considered equivalents of the present application.

The above description of the disclosed aspects is provided to enable any of those skilled in the art to make or use the present application. Various modifications to these aspects will be readily apparent to those skilled in the art, and the general principles defined herein may be applied to other aspects without departing from the scope of the present application. Therefore, the present application is not intended to be limited to the aspects shown herein but is to be in accordance with the widest scope consistent with the principles and novel features disclosed herein.

The foregoing description has been provided for purposes of illustration and description. In addition, the description is not intended to limit embodiments of the present application to the form disclosed herein. While a number of exemplary aspects and embodiments have been discussed above, those skilled in the art will recognize that certain variations, modifications, changes, additions and sub-combinations thereof are intended to fall within the scope of protection of the present disclosure.

What is claimed is:

1. A liquid-cooling heat dissipation apparatus for carrying out liquid-cooling heat dissipation on an electronic device, comprising:
    a housing unit for accommodating the electronic device, wherein the housing unit comprises a bearing housing, a first side plate and a second side plate, the bearing housing has a bearing groove, the first side plate and the second side plate are mounted at both ends of the bearing housing, a mounting cover is arranged on the bearing groove; and
    a first liquid-cooling plate arranged in the housing unit, the first liquid-cooling plate having a first inlet connector and a first outlet connector,
    wherein the electronic device comprises a first electronic unit and a second electronic unit, the first liquid-cooling plate has a first cooling surface and a second cooling surface arranged oppositely, the first electronic unit is attached to the first cooling surface, and the second electronic unit is attached to the second cooling surface; and
    cooling liquid enters from the first inlet connector and flows out from the first outlet connector, such that the first liquid-cooling plate carries out liquid-cooling heat dissipation on the first electronic unit and the second electronic unit simultaneously.

2. The liquid-cooling heat dissipation apparatus according to claim 1, wherein the first inlet connector and the first outlet connector protrude out from the first side plate and are used for being in communication with an external cooling liquid system.

3. The liquid-cooling heat dissipation apparatus according to claim 2, wherein there are further fixing mounting plates protruding and extending from two ends of the second side plate, fixing mounting holes are provided on the fixing mounting plates, there is lifting plates bending outside from the fixing mounting plates, and lifting holes are provided on the lifting plates.

4. The liquid-cooling heat dissipation apparatus according to claim 1, wherein the liquid-cooling heat dissipation apparatus is further used for carrying out liquid-cooling heat dissipation on a power supply device, the power supply device is arranged in the housing unit, and the power supply device is electrically connected to the electronic device for supplying power to the electronic device;
    wherein the liquid-cooling heat dissipation apparatus further comprises:
    a fourth liquid-cooling plate arranged in the housing unit, the fourth liquid-cooling plate having a second inlet connector and a second outlet connector, the fourth liquid-cooling plate having a third cooling surface, the power supply device is attached to the third cooling surface,
    wherein the first outlet connector is in communication with the second inlet connector by an adapter pipe, and the first inlet connector and the second outlet connector are in communication with an external cooling liquid system; or,
    the first inlet connector is in communication with the second outlet connector by the adapter pipe, the first outlet connector and the second inlet connector are in communication with the external cooling liquid system; or,
    the first inlet connector and the second inlet connector are connected to a first three-way connector respectively, the first outlet connector and the second outlet connector are connected to a second three-way connector respectively, and the first three-way connector and the second three-way connector are in communication with the external cooling liquid system.

5. The liquid-cooling heat dissipation apparatus according to claim 4, further comprising connection units, wherein the first liquid-cooling plate and the fourth liquid-cooling plate are fixedly arranged in the housing unit by the connection units respectively; or, adapter flanges are arranged on both sides of the first liquid-cooling plate and the fourth liquid-cooling plate, the connection units are arranged on the two sides of the first liquid-cooling plate and the fourth liquid-cooling plate respectively, and the connection units have guide grooves for the adapter flange to be inserted.

6. The liquid-cooling heat dissipation apparatus according to claim 5, wherein locking screws are arranged at both ends of the guide groove.

7. The liquid-cooling heat dissipation apparatus according to claim 1, wherein a power adapter and a communication connector are arranged at both ends of the second side plate respectively.

8. The liquid-cooling heat dissipation apparatus according to claim 1, wherein one surface of the first electronic unit backs onto the first liquid-cooling plate and one surface of the second electronic unit backs onto the first liquid-cooling plate are provided with a first protective plate and a second protective plate respectively.

9. The liquid-cooling heat dissipation apparatus according to claim 1, wherein thermally-conductive silicone grease is arranged between the first electronic unit and the first liquid-cooling plate, and/or thermally-conductive silicone grease is arranged between the second electronic unit and the first liquid-cooling plate.

10. The liquid-cooling heat dissipation apparatus according to claim 1, wherein the first electronic unit comprises a first substrate, the second electronic unit comprises a second substrate, the first substrate is attached to the first cooling surface, and the second substrate is attached to the second cooling surface,
wherein the first cooling surface and the second cooling surface are planes, the first substrate and the second substrate are aluminum substrates, a heating element is provided on one surface of the aluminum substrate backs onto the first liquid-cooling plate.

11. The liquid-cooling heat dissipation apparatus according to claim 1, further comprising a second liquid-cooling plate and a third liquid-cooling plate that are symmetrically located on both sides of the first liquid-cooling plate,
wherein the first liquid-cooling plate has the first cooling surface and the second cooling surface, the first electronic unit is located between the first liquid-cooling plate and the second liquid-cooling plate, and is attached to the first cooling surface of the first liquid-cooling plate; the second electronic unit is located between the first liquid-cooling plate and the third liquid-cooling plate, and is attached to the second cooling surface of the first liquid-cooling plate.

12. The liquid-cooling heat dissipation apparatus according to claim 11, wherein the second liquid-cooling plate has a third cooling surface, the third cooling surface has a first fixing protrusion arranged in a protruding manner, the first fixing protrusion abuts against the first electronic unit, and a first heat dissipation channel for heat dissipation of the first electronic unit is enclosed by the third cooling surface and the first electronic unit; and/or, the third liquid-cooling plate has a fourth cooling surface, the fourth cooling surface has a second fixing protrusion arranged in a protruding manner, the second fixing protrusion abuts against the second electronic unit, and a second heat dissipation channel for heat dissipation of the second electronic unit is enclosed by the fourth cooling surface and the second electronic unit.

13. The liquid-cooling heat dissipation apparatus according to claim 11, wherein the first liquid-cooling plate has a first liquid inlet/outlet and a second liquid inlet/outlet; the second liquid-cooling plate has a third liquid inlet/outlet and a fourth liquid inlet/outlet; the third liquid-cooling plate has a fifth liquid inlet/outlet and a sixth liquid inlet/outlet,
the first liquid inlet/outlet and the second liquid inlet/outlet are provided on a same side or on different sides,
the third liquid inlet/outlet and the fourth liquid inlet/outlet are provided on a same side or on different sides, and
the fifth liquid inlet/outlet and the sixth liquid inlet/outlet are provided on a same side or on different sides.

14. The liquid-cooling heat dissipation apparatus according to claim 11, wherein cooling capacity of the first liquid-cooling plate is greater than that of the second liquid-cooling plate and is greater than that of the third liquid-cooling plate;
the first liquid-cooling plate has a first accommodation cavity, the second liquid-cooling plate has a second accommodation cavity, and the third liquid-cooling plate has a third accommodation cavity; and heat dissipation area of the first accommodation cavity is greater than that of the second accommodation cavity, and heat dissipation area of the first accommodation cavity is greater than that of the third accommodation cavity.

15. The liquid-cooling heat dissipation apparatus according to claim 11, further comprising a power supply device and a fourth liquid-cooling plate, wherein the fourth liquid-cooling plate has a fifth cooling surface, the fifth cooling surface is attached to the power supply device for cooling the power supply device; and the fourth liquid-cooling plate has a seventh liquid inlet/outlet and an eighth liquid inlet/outlet.

16. The liquid-cooling heat dissipation apparatus according to claim 11, wherein flow direction of cooling liquid in the first liquid-cooling plate is same as that in the second liquid-cooling plate and is same as that in the third liquid-cooling plate;
or, the flow direction of the cooling liquid in the first liquid-cooling plate is opposite that in the second liquid-cooling plate and is opposite that in the third liquid-cooling plate;
or, the flow direction of the cooling liquid in the first liquid-cooling plate is same as that in one of the second liquid-cooling plate and the third liquid-cooling plate, and is opposite that in another of the second liquid-cooling plate and the third liquid-cooling plate.

17. A liquid-cooling data processing device, comprising an electronic device and a liquid-cooling heat dissipation apparatus bearing the electronic device, wherein the liquid-cooling heat dissipation apparatus is the liquid-cooling heat dissipation apparatus of claim 1, the electronic device comprises a first electronic unit and a second electronic unit, wherein the first electronic unit and the second electronic unit are hashboards.

18. The liquid-cooling heat dissipation apparatus according to claim 15, further comprising a pipeline structure, wherein the pipeline structure connects each of the liquid inlet/outlets in series and/or in parallel, the pipeline structure comprises an inlet connector, an outlet connector, a liquid-cooling pipeline group, a first liquid dispenser/collector and a second liquid dispenser/collector, the liquid-cooling pipeline group is capable of connecting to the first liquid-cooling plate, the second liquid-cooling plate, the third liquid-cooling plate and/or the fourth liquid-cooling plate via the first liquid dispenser/collector and the second liquid dispenser/collector, and the liquid-cooling pipeline group is further connected to an external cold source via the inlet connector and the outlet connector.

19. The liquid-cooling heat dissipation apparatus according to claim 18, wherein the inlet connector is connected to the seventh liquid inlet/outlet of the fourth liquid-cooling plate, the eighth liquid inlet/outlet of the fourth liquid-cooling plate is connected to the first liquid inlet/outlet of the first liquid-cooling plate, the second liquid inlet/outlet of the first liquid-cooling plate is connected to the fourth liquid inlet/outlet of the second liquid-cooling plate and the sixth liquid inlet/outlet of the third liquid-cooling plate respectively via the first liquid dispenser/collector, and the third liquid inlet/outlet of the second liquid-cooling plate and the fifth liquid inlet/outlet of the third liquid-cooling plate are connected to the outlet connector via the second liquid dispenser/collector.

20. A temperature equalization method for a liquid-cooling heat dissipation apparatus, wherein the temperature equalization method is applied to the liquid-cooling heat dissipation apparatus, the liquid-cooling heat dissipation apparatus is used for cooling a first electronic unit and a second electronic unit of an electronic device, the liquid-cooling heat dissipation apparatus comprises a housing unit for accommodating the electronic device, a first liquid-cooling plate, and a second liquid-cooling plate and a third liquid-cooling plate that are located on both sides of the first liquid-cooling plate; wherein the housing unit comprises a bearing housing, a first side plate and a second side plate, the bearing housing has a bearing groove, the first side plate and the second side plate are mounted at both ends of the bearing housing, a mounting cover is arranged on the bearing groove: the first liquid-cooling plate has a first cooling surface and a second cooling surface, the first electronic unit is located between the first liquid-cooling plate and the second liquid-cooling plate and is attached to the first cooling surface of the first liquid-cooling plate; the second electronic unit is located between the first liquid-cooling plate and the third liquid-cooling plate and is attached to the second cooling surface of the first liquid-cooling plate;

the temperature equalization method comprises following steps:

controlling the first liquid-cooling plate, the second liquid-cooling plate and the third liquid-cooling plate to be connected in series and/or in parallel;

controlling an external cold source to convey cooling liquid to the first liquid-cooling plate, the second liquid-cooling plate and the third liquid-cooling plate; and making the first liquid-cooling plate, the second liquid-cooling plate and the third liquid-cooling plate cool the first electronic unit and the second electronic unit respectively.

* * * * *